(12) United States Patent
Zhu et al.

(10) Patent No.: US 8,772,144 B2
(45) Date of Patent: Jul. 8, 2014

(54) VERTICAL GALLIUM NITRIDE SCHOTTKY DIODE

(75) Inventors: TingGang Zhu, Cupertino, CA (US); Anup Bhalla, Santa Clara, CA (US); Ping Huang, Songjiang Shanghai (CN); Yueh-se Ho, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 326 days.

(21) Appl. No.: 13/294,903

(22) Filed: Nov. 11, 2011

(65) Prior Publication Data
US 2013/0119393 A1    May 16, 2013

(51) Int. Cl.
*H01L 21/28* (2006.01)
*H01L 21/44* (2006.01)

(52) U.S. Cl.
USPC ..... 438/572; 438/571; 438/458; 257/E21.368

(58) Field of Classification Search
CPC .................................. H01L 29/66212
USPC ................... 438/572; 257/E21.368
See application file for complete search history.

(56) References Cited

U.S. PATENT DOCUMENTS

| | | | |
|---|---|---|---|
| 6,071,795 A | 6/2000 | Cheung et al. | |
| 7,229,866 B2 | 6/2007 | Zhu et al. | |
| 7,842,974 B2 | 11/2010 | Zhu | |
| 8,013,414 B2 | 9/2011 | Zhu | |
| 2007/0029633 A1 | 2/2007 | Hirose et al. | |
| 2007/0093037 A1 | 4/2007 | Zhu et al. | |
| 2009/0075455 A1* | 3/2009 | Mishra | 438/458 |
| 2010/0019279 A1 | 1/2010 | Chen et al. | |
| 2011/0101369 A1 | 5/2011 | Zhu | |
| 2012/0007097 A1 | 1/2012 | Hebert | |
| 2013/0087835 A1 | 4/2013 | Edwards et al. | |

\* cited by examiner

*Primary Examiner* — Daniel Luke
(74) *Attorney, Agent, or Firm* — Van Pelt, Yi & James LLP

(57) ABSTRACT

A vertical conduction nitride-based Schottky diode is formed using an insulating substrate which was lifted off after the diode device is encapsulated on the front side with a wafer level molding compound. The wafer level molding compound provides structural support on the front side of the diode device to allow the insulating substrate to be lifted off so that a conductive layer can be formed on the backside of the diode device as the cathode electrode. A vertical conduction nitride-based Schottky diode is thus realized. In another embodiment, a protection circuit for a vertical GaN Schottky diode employs a silicon-based vertical PN junction diode connected in parallel to the GaN Schottky diode to divert reverse bias avalanche current.

9 Claims, 27 Drawing Sheets

VERTICAL GALLIUM NITRIDE SCHOTTKY DIODE

CROSS-REFERENCE TO RELATED APPLICATION

The present application is related to concurrently filed and commonly assigned U.S. patent application entitled "Termination Structure for Gallium Nitride Schottky Diode," having at least one common inventor, having patent application Ser. No. 13/294,917, which patent application is incorporated herein by reference in its entirety.

FIELD OF THE INVENTION

The invention relates to gallium nitride (GaN) semiconductor devices and, in particular, to a vertical GaN Schottky diode formed on an insulating substrate subsequently lifted off.

DESCRIPTION OF THE RELATED ART

A Schottky diode is a semiconductor device formed by a metal contacting a semiconductor layer. The junction between the metal and the semiconductor layer is a rectifying junction and is characterized by a lower energy barrier for free carriers than a PN junction, and unipolar current conduction, as opposed to bipolar current conduction as in a PN junction. As such, Schottky diodes begin current conduction at a lower forward bias voltage than a typical PN junction diode, but also have reversed bias leakage currents that are higher than a typical PN junction diode. Because Schottky diodes are unipolar devices, they typically switch faster than a PN junction diode. Schottky diodes are ideal for applications where switching loss is the major source of energy consumption, such as in switch-mode power supplies (SMPS).

Electronic devices made from nitride-based compound semiconductor materials are known. Such electronic devices are also known as III-Nitride semiconductor devices as being formed from Group III nitride based materials. Nitride-based compound semiconductor devices are desirable for their wider band gap and higher breakdown voltage characteristics, rendering them suitable for high voltage and high temperature applications. In particular, III-V gallium nitride (GaN) compound semiconductor Schottky diodes having a high breakdown voltage and a low on-resistance have been described. The efficiency of switch-mode power supplies can be improved through the use of III-Nitride semiconductor Schottky barrier diodes.

However, nitride-based semiconductor Schottky diodes have certain shortcomings as compared to silicon-based Schottky diodes. Silicon-based Schottky diodes employ a vertical conduction path while nitride-based Schottky diodes often rely on a lateral conduction path. This is because nitride-based semiconductor devices are typically formed on top of an insulating substrate and/or an insulating buffer layer epitaxially grown on a conducting or non-conducting substrate. Accordingly, both the anode and the cathode of the Schottky diodes have to be formed on the top surface of the device, opposite from the substrate, resulting in a lateral conduction device. Schottky diodes with a lateral conduction path tend to have a higher turn-on resistance when the device is forward biased because the forward current must travel over a relatively long conduction path and non-uniform current distribution results.

More specifically, nitride-based semiconductor devices are usually formed as epitaxial layers grown on substrate materials including silicon, Sapphire, SiC and bulk GaN substrates. While growing a GaN layer on bulk GaN crystal substrate yields the best result, the material cost for bulk GaN substrate is prohibitively high, making the use of bulk GaN substrate impractical for most electronic devices. The same is true for SiC substrate. Meanwhile, while silicon substrates are the lowest cost material, growing a GaN layer on a silicon substrate yields poor result because of significant lattice mismatch between the GaN epitaxial layer and the silicon substrate.

Sapphire substrates become a good candidate for nitride-based semiconductor devices because of its relatively low cost due to high volume use in LED manufacturing and adequate lattice matching for good epitaxial layer quality. GaN semiconductor devices built on insulating Sapphire substrates are therefore lateral conducting devices or quasi-vertical conducting devices. Many challenges exist for forming vertical conducting GaN devices on insulating Sapphire substrates.

Furthermore, reliable GaN semiconductor devices require effective termination structure to reduce the effect of electric field crowding at the edges of the anode electrode, especially for high voltage devices. Conventional termination structures include p-type guard ring with field plate structures at the anode terminal of the GaN Schottky diode. However, due to the wide-band gap nature of nitride-based semiconductor devices, it is difficult to form annealed or activated p-type region using conventional implant and anneal processes. Thus, conventional guard ring structures for nitride-based semiconductor devices are non-activated.

U.S. Pat. No. 7,229,866 describes GaN Schottky diodes formed on conducting and non-conducting substrates and further describes the use of non-activated guard ring. The non-activated guard ring is formed by ion implantation into a semiconductor contact layer where the implanted region is not completely annealed and the implanted species are not activated. The implanted region forms a high resistive region with embedded defect density which can lead to poor reliability in operation.

SUMMARY OF THE INVENTION

According to one embodiment of the present invention, a vertical conduction nitride-based Schottky diode includes a nitride-based semiconductor body of a first conductivity type; a first metal layer formed on a front side of the nitride-based semiconductor body forming a Schottky junction therewith where the first metal layer forms an anode electrode of the Schottky diode; a second metal layer formed on the first metal layer; a third metal layer formed on a backside of the nitride-based semiconductor body where the third metal layer forms an ohmic contact with the semiconductor body and forming a cathode electrode of the Schottky diode; a solder ball formed on the second metal layer; and a wafer level molding layer formed on the front side of the nitride-based semiconductor body where the wafer level molding layer encapsulates the second metal layer and at least part of the solder ball. The Schottky diode has a vertical current path from the solder ball, through the anode electrode and the Schottky junction to the cathode electrode.

In another embodiment, a method for forming a vertical conduction nitride-based Schottky diode includes providing an insulating substrate; forming a nitride-based semiconductor body of a first conductivity type on the insulating substrate; forming a first metal layer on a front side of the nitride-based semiconductor body to form a Schottky junction where the first metal layer forms an anode electrode of the Schottky diode; forming a second metal layer on the first metal layer; forming a solder ball on the second metal layer; forming a wafer level molding layer on the front side of the nitride-based semiconductor body where the wafer level molding layer encapsulates the second metal layer and at least part of the solder ball; separating the insulating substrate from the semiconductor body to expose a backside of the nitride-based semiconductor body; and forming a third metal layer on an exposed backside of the nitride-based semiconductor body where the third metal layer forms an ohmic contact with the semiconductor body and forming a cathode electrode of the Schottky diode. The Schottky diode has a vertical current path from the solder ball, through the anode electrode and the Schottky junction to the cathode electrode.

The present invention is better understood upon consideration of the detailed description below and the accompanying drawings.

DETAILED DESCRIPTION OF THE PREFERRED EMBODIMENTS

In accordance with the principles of the present invention, a vertical conduction nitride-based compound semiconductor Schottky diode ("vertical nitride-based Schottky diode") is formed using an insulating substrate which was lifted off after the diode device is encapsulated on the front side with a wafer level molding compound. The wafer level molding compound provides structural support on the front side of the diode device to allow the insulating substrate to be lifted off so that a conductive layer can be formed on the backside of the diode device as the cathode electrode. A vertical conduction nitride-based Schottky diode is thus realized.

According to another aspect of the present invention, a termination structure for a nitride-based Schottky diode includes a guard ring formed by an epitaxially grown P-type nitride-based compound semiconductor layer and dielectric field plates formed on the guard ring. The termination structure is formed at the edge of the anode electrode of the Schottky diode and has the effect of reducing electric field crowding at the anode electrode edge, especially when the Schottky diode is reverse biased. In one embodiment, the P-type epitaxial layer includes a step recess to further enhance the field spreading effect of the termination structure.

Finally, according to yet another aspect of the present invention, a protection circuit for a vertical GaN Schottky diode employs a silicon-based vertical PN junction diode connected in parallel to the GaN Schottky diode to divert reverse bias avalanche current.

In the following description, the term "nitride-based compound semiconductor" or "III-nitride compound semiconductor" refers to those III-V compound semiconductor materials formed between nitrogen and the elements in Group III of the periodic table, usually aluminum (Al), gallium (Ga), and indium (In). The term also refers to ternary and tertiary compounds such as AlGaN and AlInGaN. The preferred materials for the nitride-based compound semiconductor Schottky diode include GaN and AlGaN. In the following description, Schottky diodes formed using gallium-nitride (GaN) compound semiconductor are sometimes referred to as "GaN Schottky diodes". However, the use of GaN as the nitride-based semiconductor material is illustrative only and the nitride-based compound semiconductor Schottky diodes of the present invention can be formed using other III-V compound semiconductor materials, presently known or to be developed.

Vertical GaN Schottky Diode

Figure 1:
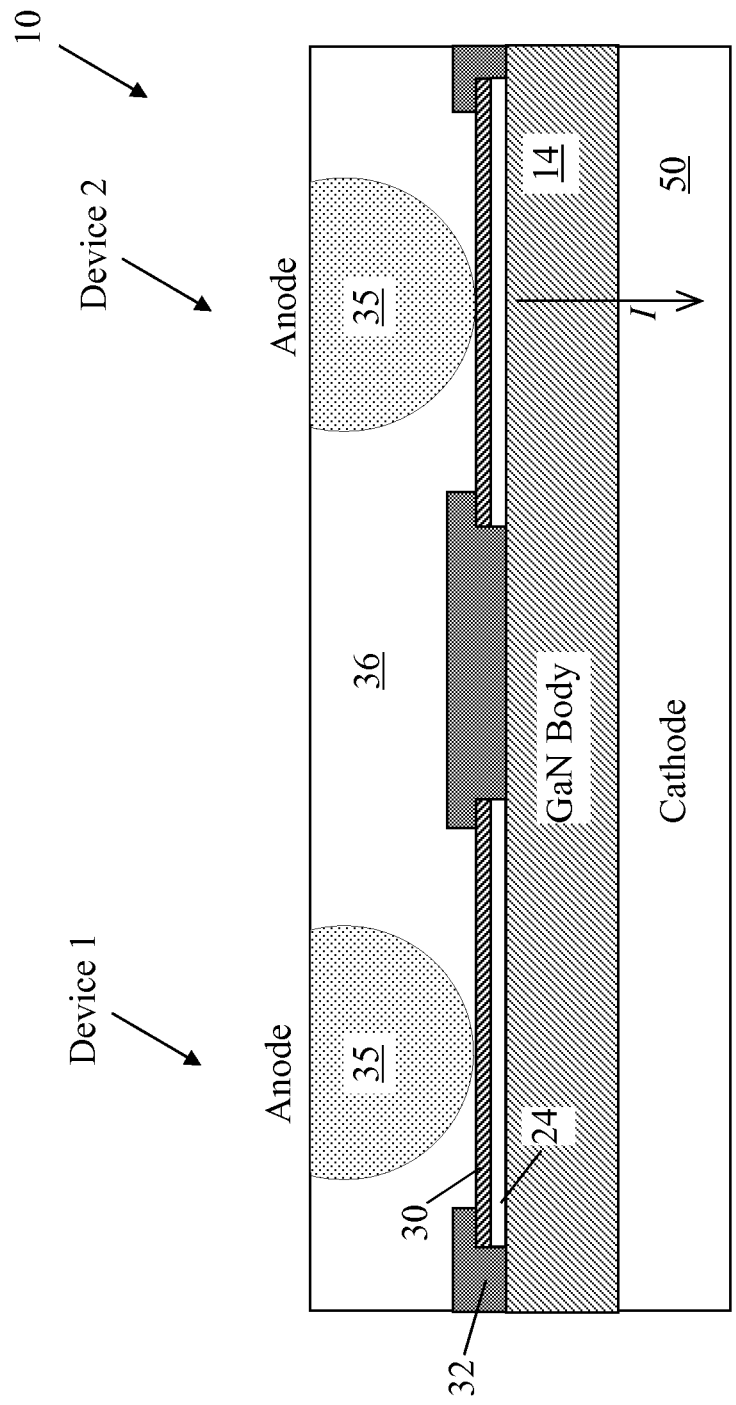
FIG. 1 is a cross-sectional view of a vertical GaN Schottky diode according to one embodiment of the present invention.

FIG. 1 is a cross-sectional view of a vertical GaN Schottky diode according to one embodiment of the present invention. Referring to FIG. 1, a vertical GaN Schottky diode 10 is formed by a nitride-based compound semiconductor body 14 and a Schottky metal layer 24 in contact with the semiconductor body 14. In embodiments of the present invention, the nitride-based compound semiconductor body 14 is formed by one or more GaN semiconductor layers, typically having N-type conductivity and with different doping concentrations. A Schottky junction is formed at the junction of the Schottky metal layer 24 and the N-type GaN body 14. The anode terminal of the GaN Schottky diode 10 is formed on a front side of the device structure while the cathode terminal is formed on the backside of the device structure so that a vertical current flow results to realize a vertical conduction Schottky diode device.

More specifically, the anode electrode of the GaN Schottky diode 10 is formed by a solder ball 35 formed on a bond metal layer 30 formed on the Schottky metal layer 24 on the front side of the device structure. The Schottky metal layer 24 and the bond metal layer 30 may be passivated at the anode terminal edges by a passivation layer 32. The front side of the GaN Schottky diode 10, including the anode electrode formed thereon, is encapsulated by a wafer level molding compound 36, which provides structural support for the GaN Schottky diode 10 and allows the removal of the insulating substrate on which the GaN body 14 was originally formed, as will be explained in more detail below. The cathode electrode of the GaN Schottky diode 10 is formed by a cathode metal layer 50 formed on the backside of the device structure and in electrical contact with the GaN body 14. A diode current path from the anode electrode to the cathode electrode runs vertically through the GaN Schottky diode 10 from the solder ball 35 to the cathode metal layer 50.

In the present illustration, one or more vertical GaN Schottky diodes (device 1 and device 2) are formed on the common GaN body 14. The diode devices are connected in parallel and may be used as an array of Schottky diodes. Alternately, in some embodiments, the GaN Schottky diode devices may be singulated to use as discrete vertical conduction Schottky diodes. For instance, the Schottky diode device 1 and the Schottky diode device 2 in FIG. 1 may be separated at the passivation layer 32 therebetween.

Figure 2:
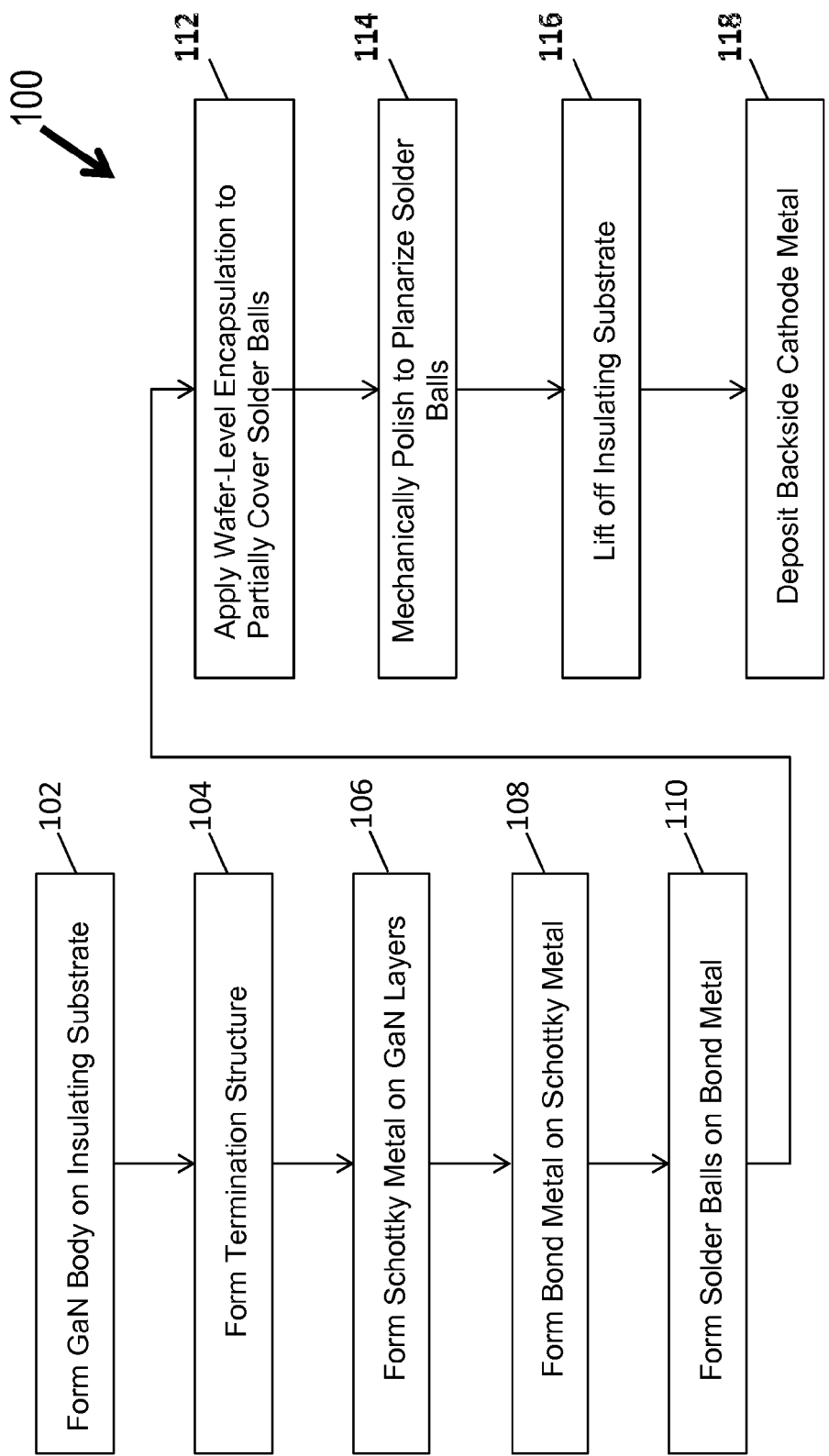
FIG. 2 is a flow chart illustrating the fabrication process for forming the vertical GaN Schottky diode of FIG. 1 according to embodiments of the present invention.

The process for forming the vertical GaN Schottky diode 10 of FIG. 1 will now be described with reference to FIG. 2 and FIGS. 3(a)-(m). FIG. 2 is a flow chart illustrating the fabrication process for forming the vertical GaN Schottky diode of FIG. 1 according to embodiments of the present invention. FIGS. 3(a)-(m) are cross-sectional views of a vertical GaN Schottky diode during the intermediate steps of the fabrication process of FIG. 2 according to embodiments of the present invention.

Figure 3A:
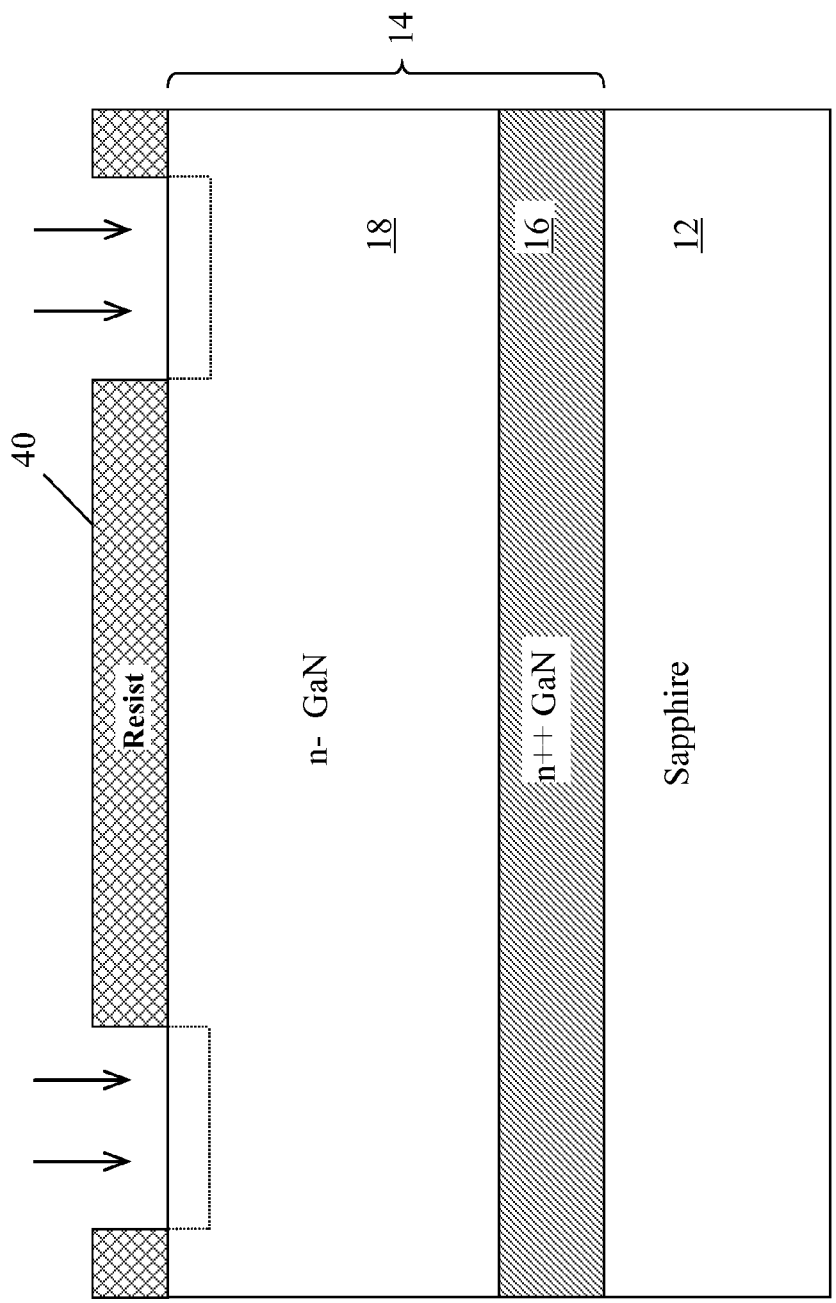
FIGS. 3(a)-(m) are cross-sectional views of a vertical GaN Schottky diode during the intermediate steps of the fabrication process of FIG. 2 according to embodiments of the present invention.

Referring to FIG. 2 and FIGS. 3(a)-3(m), the fabrication process starts with providing an insulating substrate 12 and forming the GaN semiconductor body 14 on the insulating substrate 12 (step 102), as shown in FIG. 3(a). In the present embodiment, the insulating substrate 102 is a sapphire substrate. Furthermore, in the present embodiment, the GaN semiconductor body 14 includes a heavily doped N-type GaN layer 16 ("n++ GaN layer 16") formed on the sapphire substrate 12 and a lightly doped GaN layer 18 ("n− GaN layer 18") formed on the heavily doped GaN layer 16. The fabrication process of the present invention uses a sapphire substrate for the GaN Schottky diode to exploit the advantages of sapphire's close lattice match with the GaN layers, thereby forming high quality GaN layers, and of sapphire's reasonable material cost.

The fabrication process proceeds by forming a termination structure for the GaN Schottky diode (step 104). The termination structure functions to suppress electric field crowding at the edge of the anode electrode to be formed. Conventional termination structures include P-type guard ring structures or dielectric field plate structures formed around the perimeter of the anode electrode. The termination structure has the effect of redistributing the electric field at the termination region of the anode electrode so that the breakdown voltage of the Schottky diode device can be increased. In the present embodiment, the termination structure employed is a P-type guard ring and a dielectric field plate. The use of the P-type guard ring and dielectric field plate as the termination structure is illustrative only. Other termination structures, presently known or to be developed, may be employed in the GaN Schottky diode of the present invention.

Figure 3B:
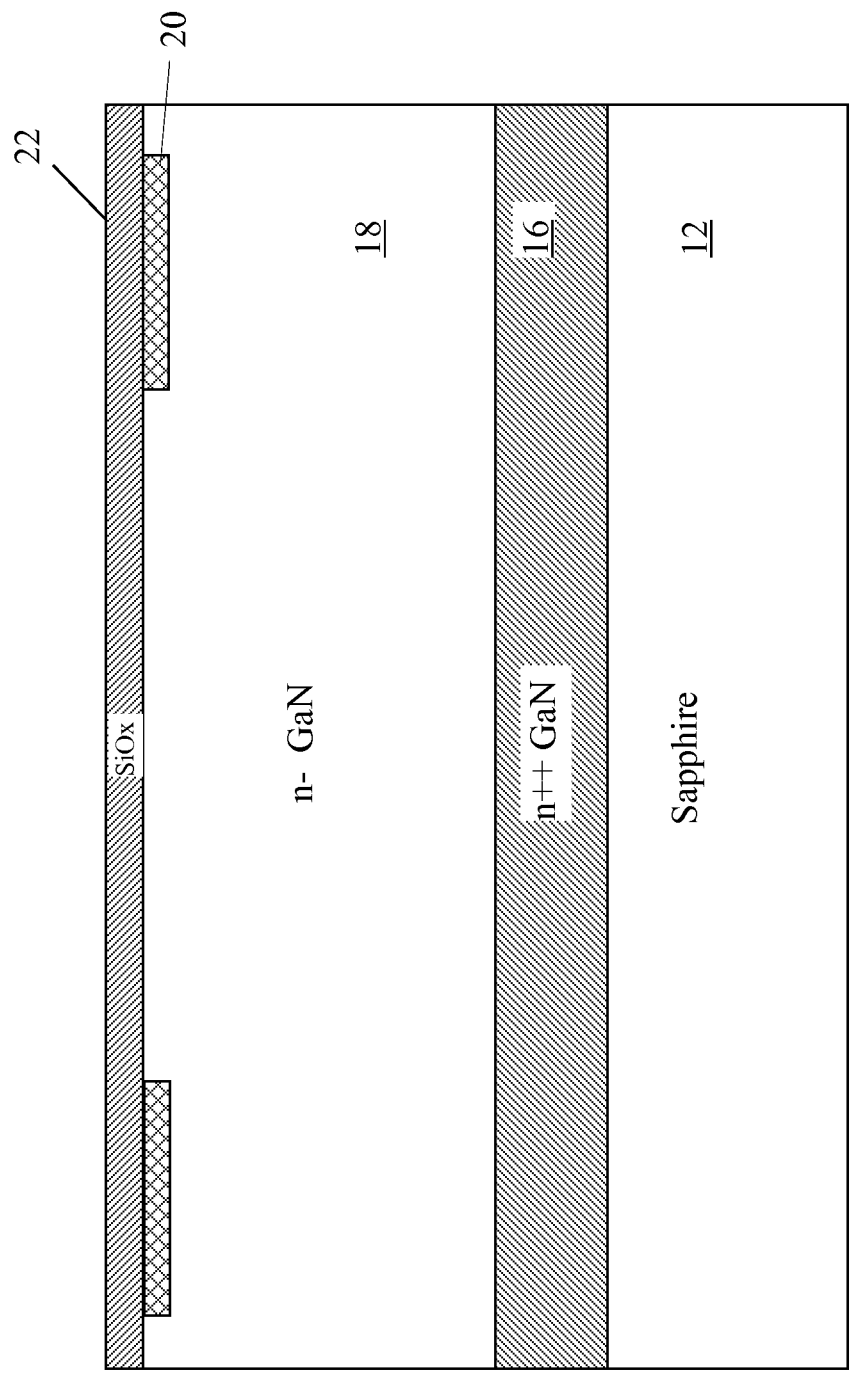
Figure 3C:
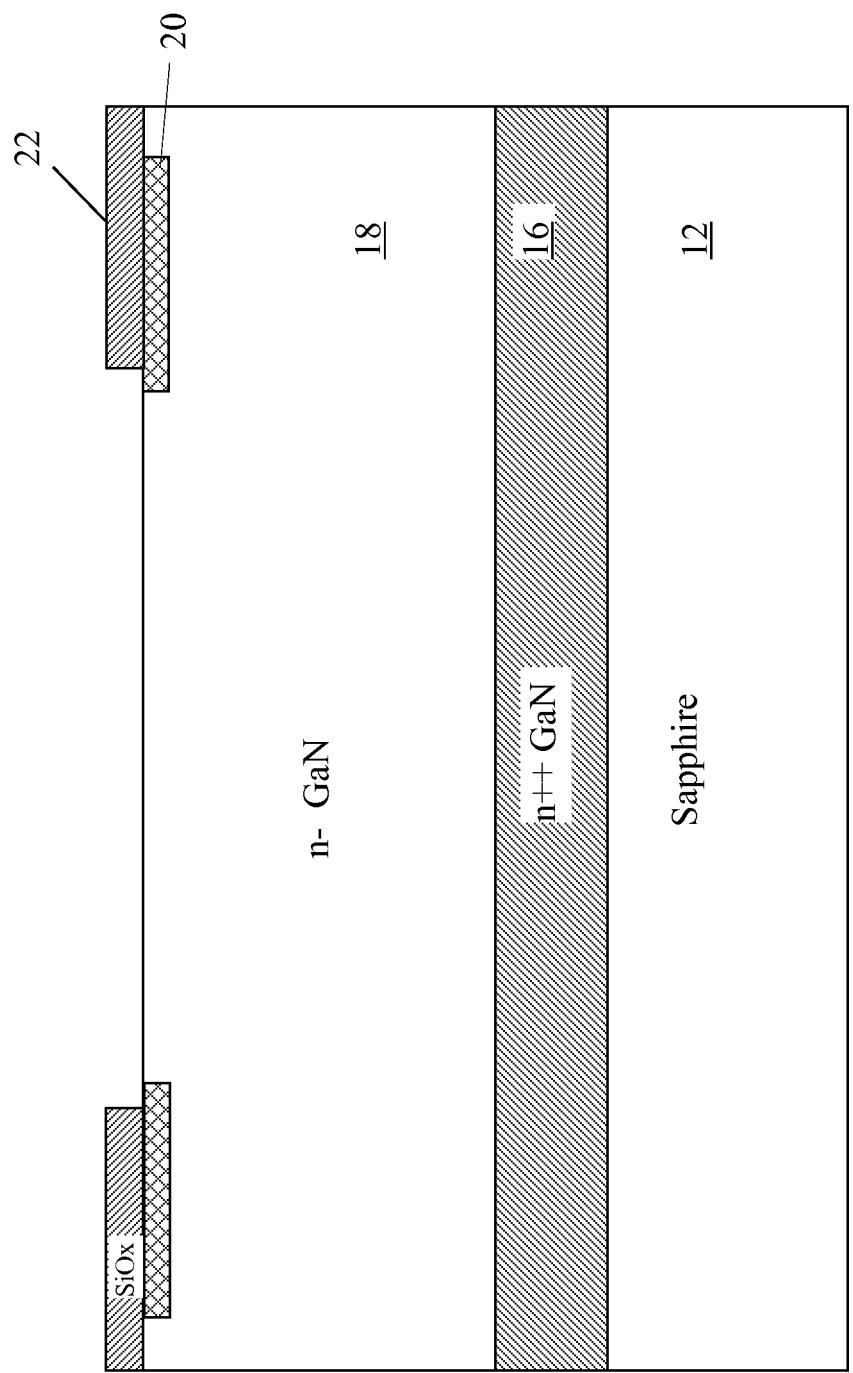

To form the P-type guard ring, a photoresist pattern 40 is formed on the GaN semiconductor body 14 (FIG. 3(a)). More specifically, the photoresist pattern 40 is formed on the top surface of the n− GaN layer 18. An ion implantation process with p-type dopants is then carried out using the photoresist pattern 40 as a mask. After implantation, a p-type region 20 is formed at the top surface of the n− GaN layer 18 to serve as the guard ring, as shown in FIG. 3(b). In the cross-sectional view in FIG. 3(b), the p-type guard ring 20 is shown as being formed on two sides of the n− GaN layer 18. In the actual device, the p-type guard ring 20 encircles the anode electrode of the GaN Schottky diode to suppress electric field crowding along the entire edge of the anode electrode. The p-type guard ring 20 may or may not be activated or annealed in subsequent processing.

After P-type guard ring 20 is formed, the resist pattern is removed and a silicon oxide layer (SiOx) 22 is deposited over the surface of the n− GaN layer 18 (FIG. 3(b)). The silicon oxide layer 22 is patterned to define an opening for the anode electrode and also to form a dielectric field plate as part of the termination structure (FIG. 3(c)).

Figure 3D:
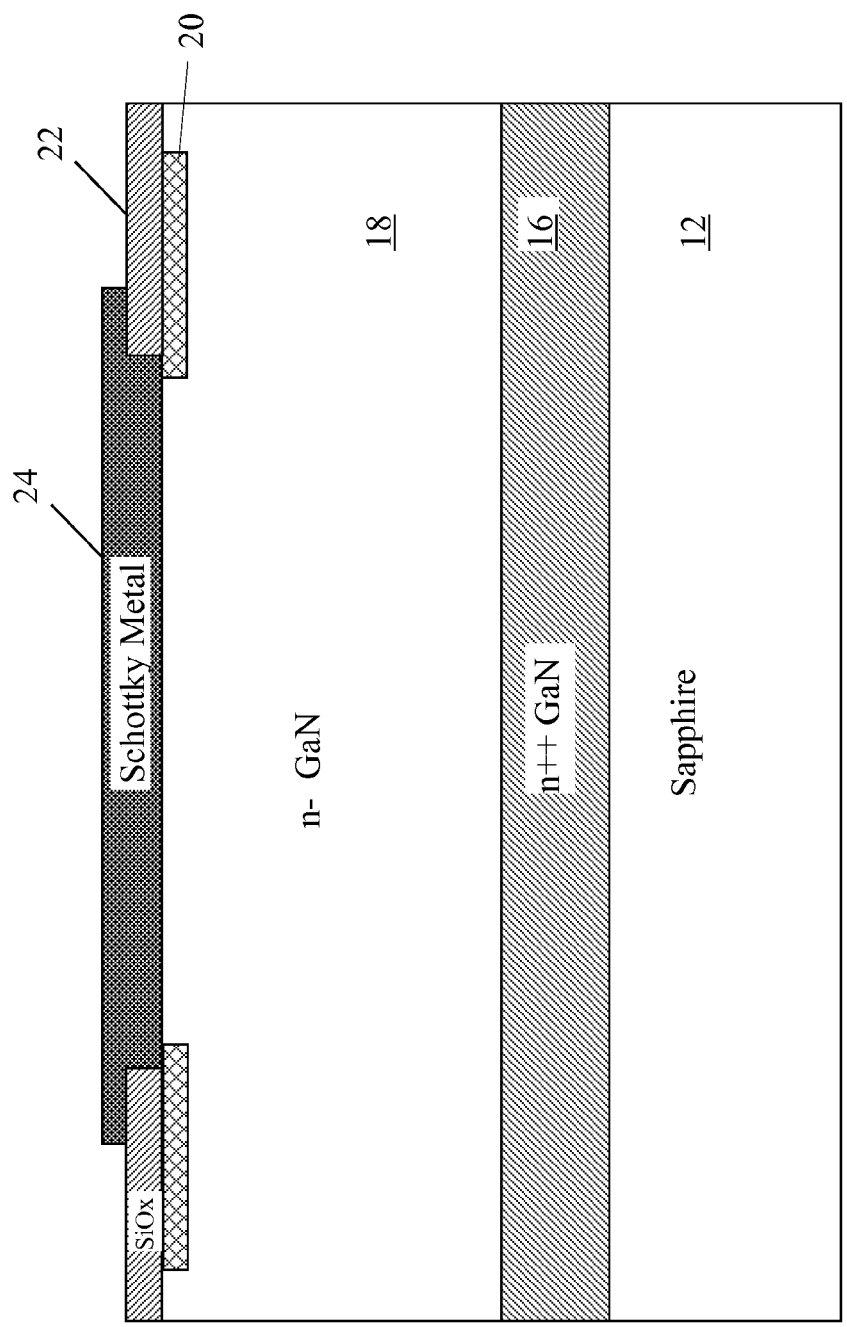
Figure 3E:
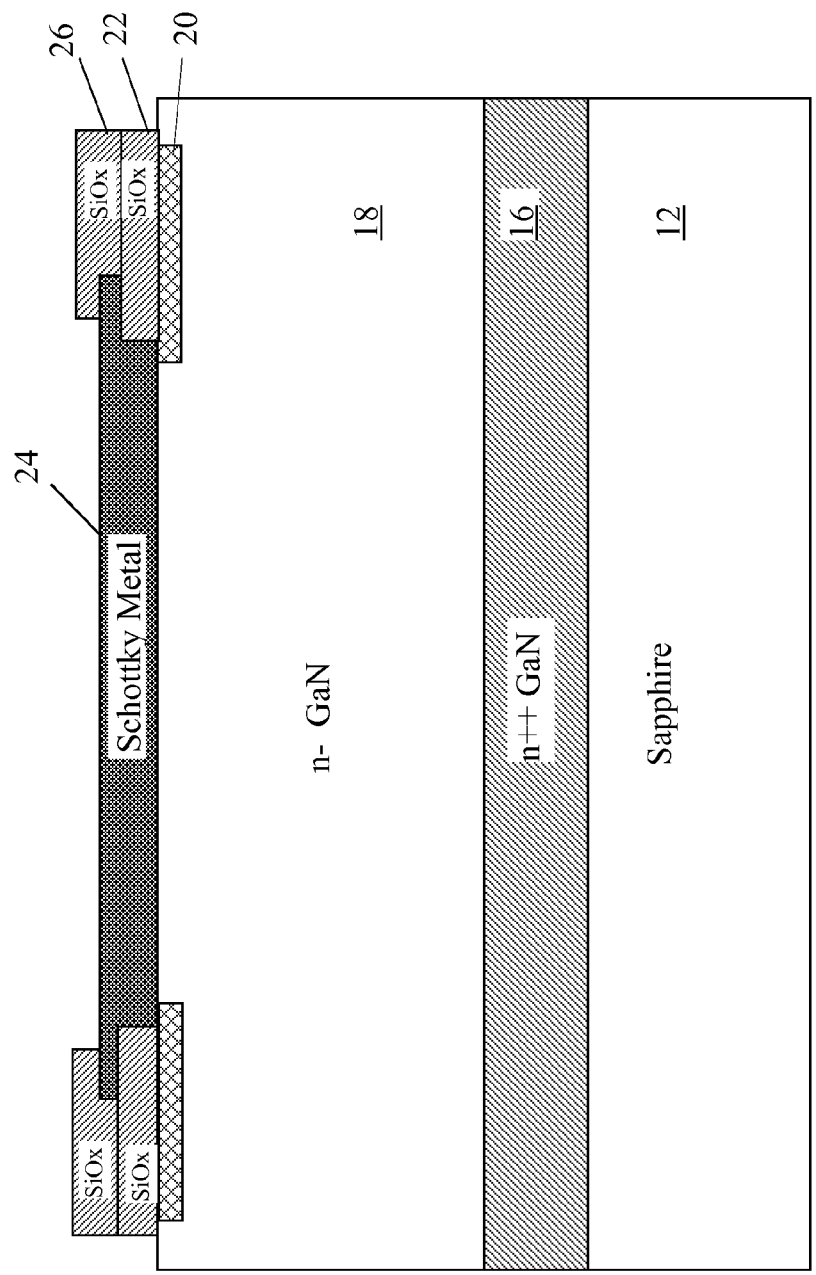

Then, a Schottky metal layer 24 is deposited on the top surface of the n-GaN layer 18 and patterned to form a Schottky junction with the lightly doped GaN layer 18 (step 106), as shown in FIG. 3(d). The Schottky metal layer 24 for forming a Schottky junction may be a metal selected from the group of Ni, Pt, Au, Co, Pd, Cr, Rh, Re, PtSi, V, W, WSi and NiSi. The Schottky metal layer 24 may also be a compound or alloy formed by the metals in this group, such as Ni/Au. Then, a second silicon oxide layer (SiOx) 26 is deposited on the top of the Schottky metal layer 24 and is patterned to define an opening for the anode electrode and also to passivate the edge of the Schottky metal layer, as shown in FIG. 3(e). Silicon oxide layer 26 also serves as an additional field plate layer of the termination structure.

Figure 3F:
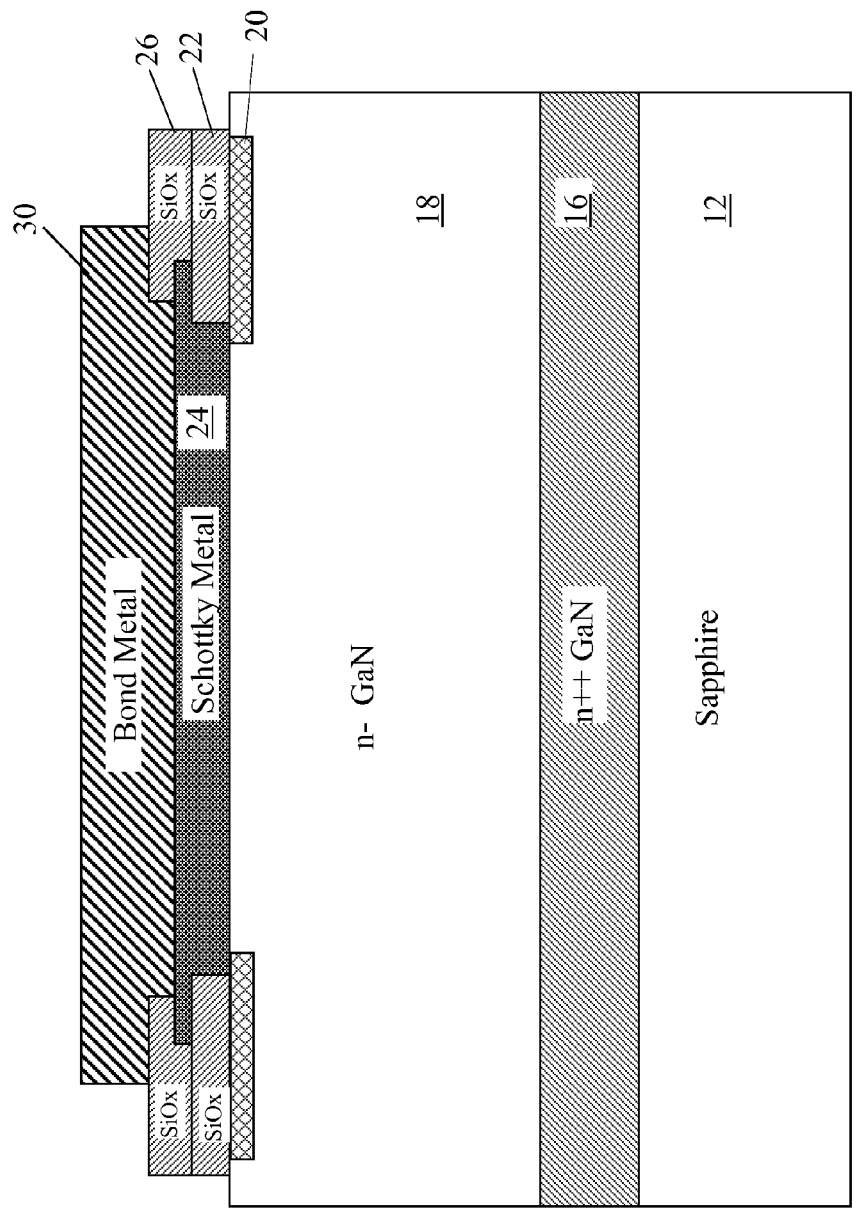

Then, a bond metal layer 30 is deposited on the top surface of the Schottky metal layer 24 and patterned to form a bonding pad for the anode electrode (step 108), as shown in FIG. 3(f). Then, a passivation layer 32, such as a polyimide layer is deposited on the bond metal and patterned to define an opening for the bonding pad while the passivation layer 32 protects the edge areas of the GaN Schottky diode, as shown in FIG. 3(g).

As thus processed, a GaN Schottky diode is formed on the insulating sapphire substrate 12. In embodiments of the present invention, the heavily doped GaN layer 16 has a thickness of about 1-3 μm and a doping concentration of about $1 \times 10^{18}$-$1 \times 10^{19}$ cm$^{-3}$, and the lightly doped GaN layer 18 has a thickness of about 3-20 μm and a doping concentration of about $1$-$2 \times 10^{14$-$17}$ cm$^{-3}$. In embodiments of the present invention, the Schottky metal layer 24 is a Ni/Au layer and the bond metal layer 30 is a Ti/Al layer.

Figure 3G:
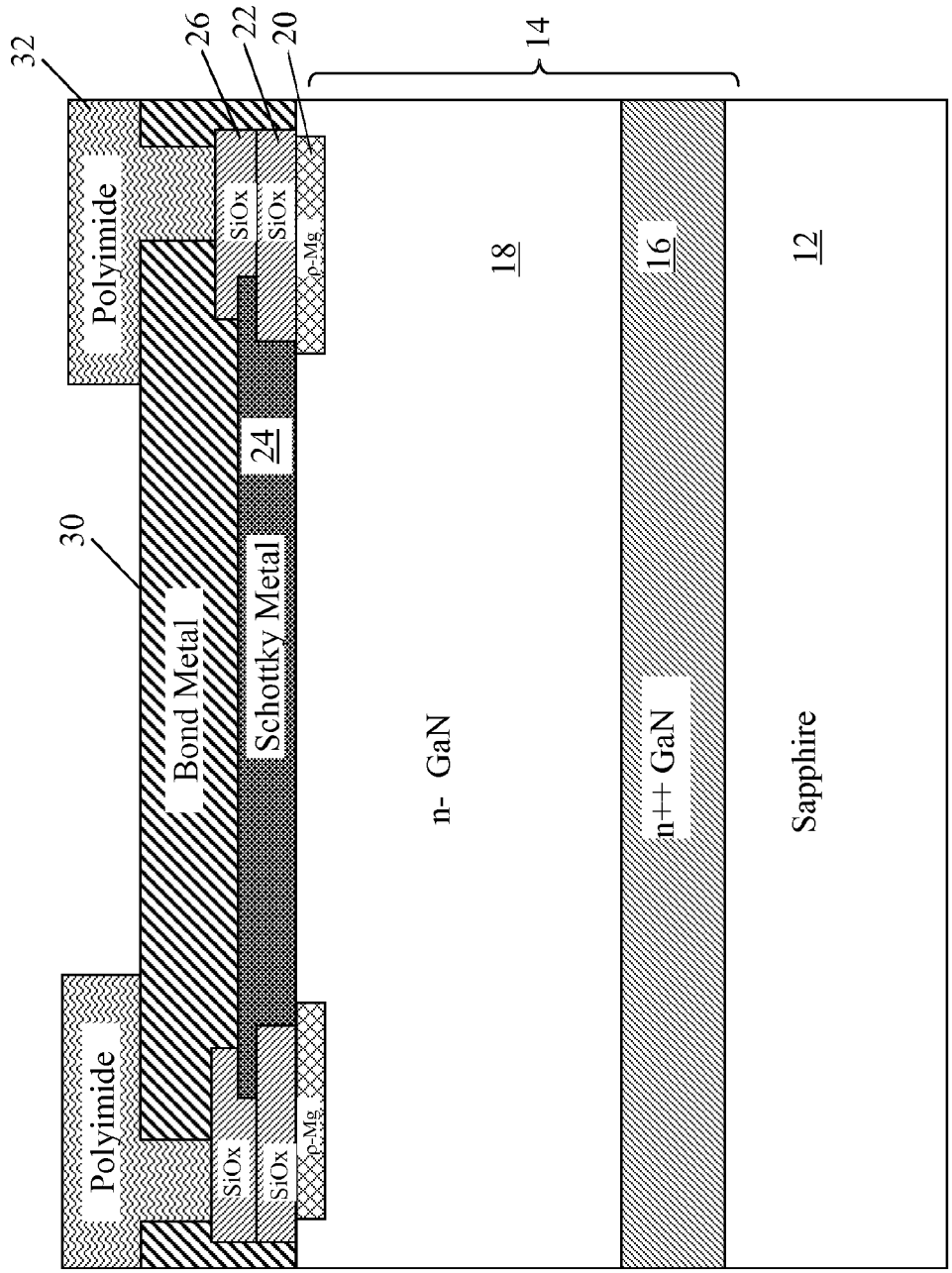

To form a vertical conduction GaN Schottky diode using the device structure as formed in FIG. 3(g), the insulating sapphire substrate 12 is to be removed so that a backside cathode electrode can be formed. In accordance with embodiments of the present invention, a wafer level encapsulation layer is formed on the front side of the device structure where the encapsulation layer serves as a support layer to allow the device structure to be safely and effectively handled after the insulating sapphire substrate 12 is removed. Electrical connection to the anode electrode is formed in the wafer encapsulation layer to enable connectivity to the anode of the Schottky diode underneath the wafer encapsulation layer.

Figure 3H:
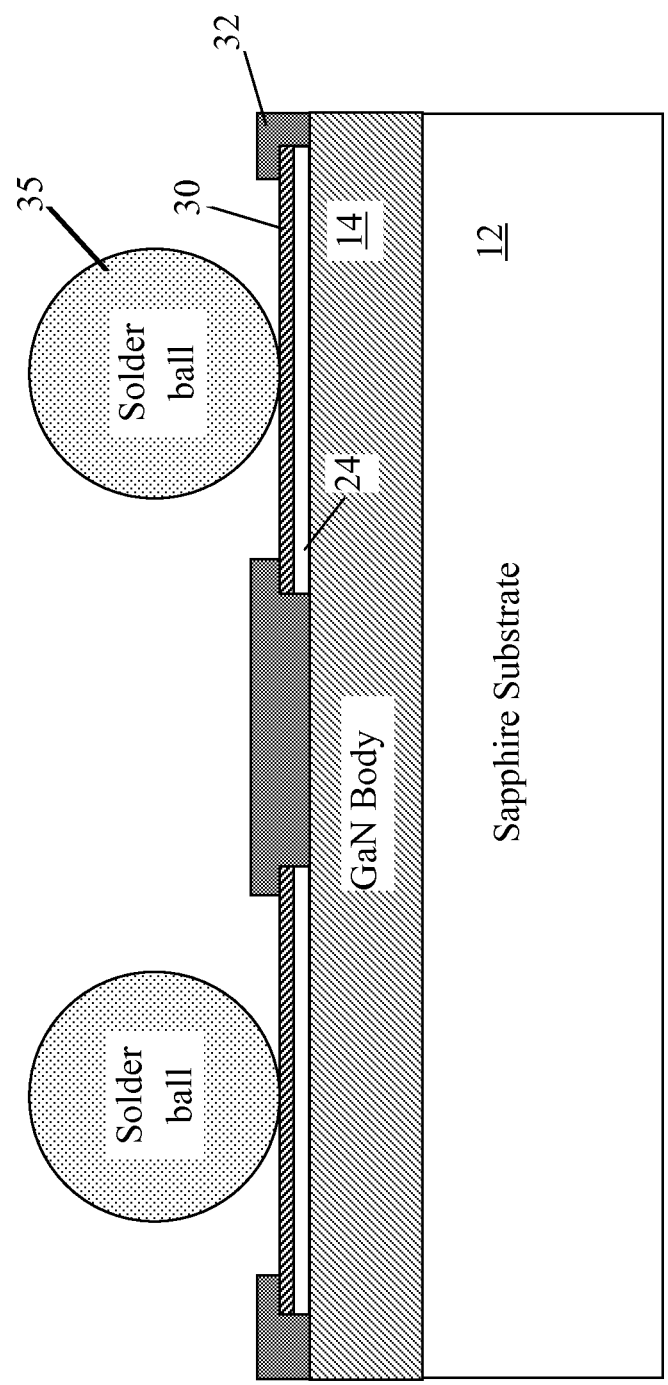
Figure 3I:
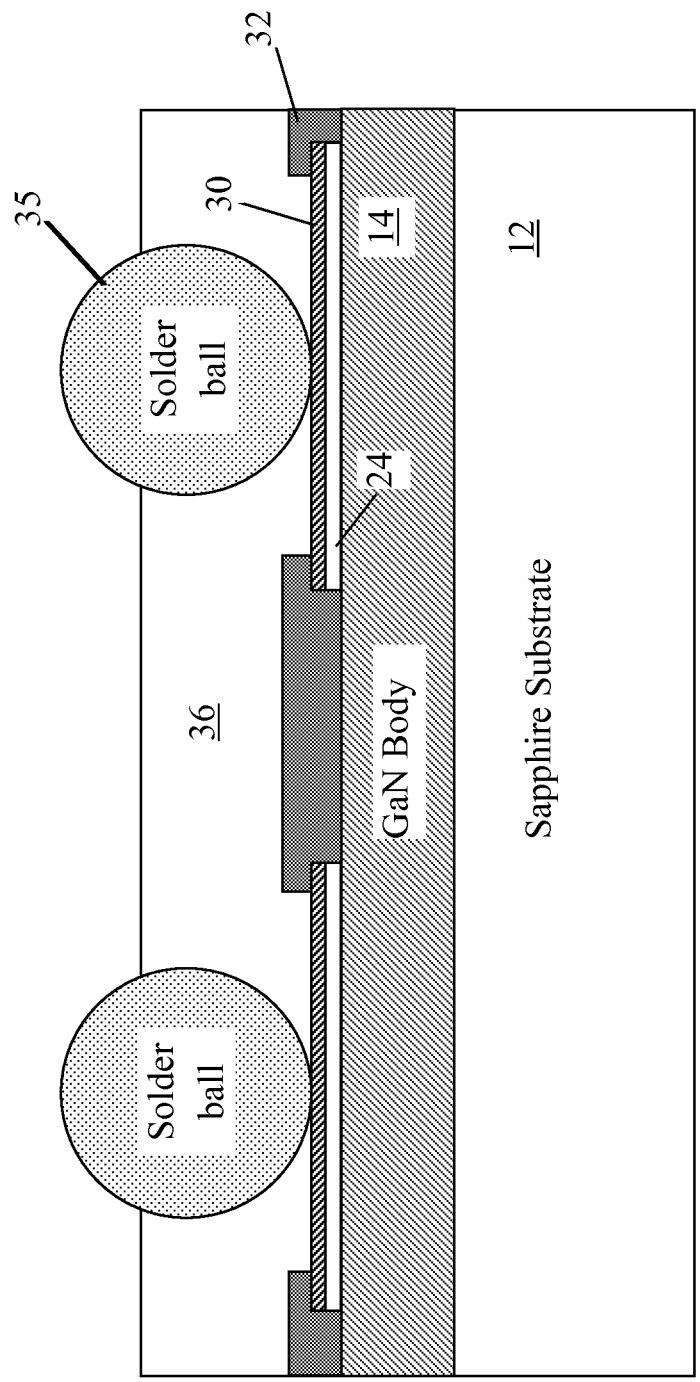

Accordingly, referring to FIG. 3(h), a solder ball 35 is formed on the bond metal pad 30 (step 110). The solder ball 35 is used to provide the electrical connectivity to the anode electrode. Then, a wafer level encapsulation layer 36 is formed on the front side of the device structure (step 112), as shown in FIG. 3(i). In one embodiment, the wafer level encapsulation layer 36 is a wafer level molding layer and can be formed using a molding compound for integrated circuits, such as an epoxy molding compound. The wafer level molding layer 36 partially covers the solder ball 35.

Figure 3J:
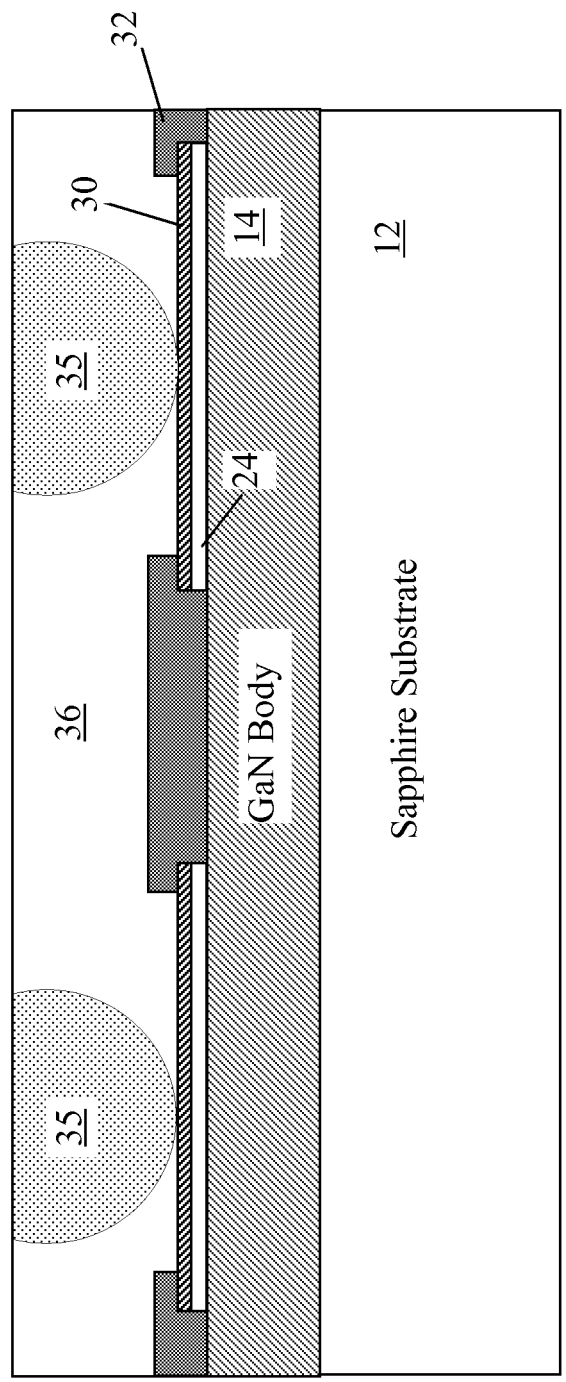
Figure 3K:
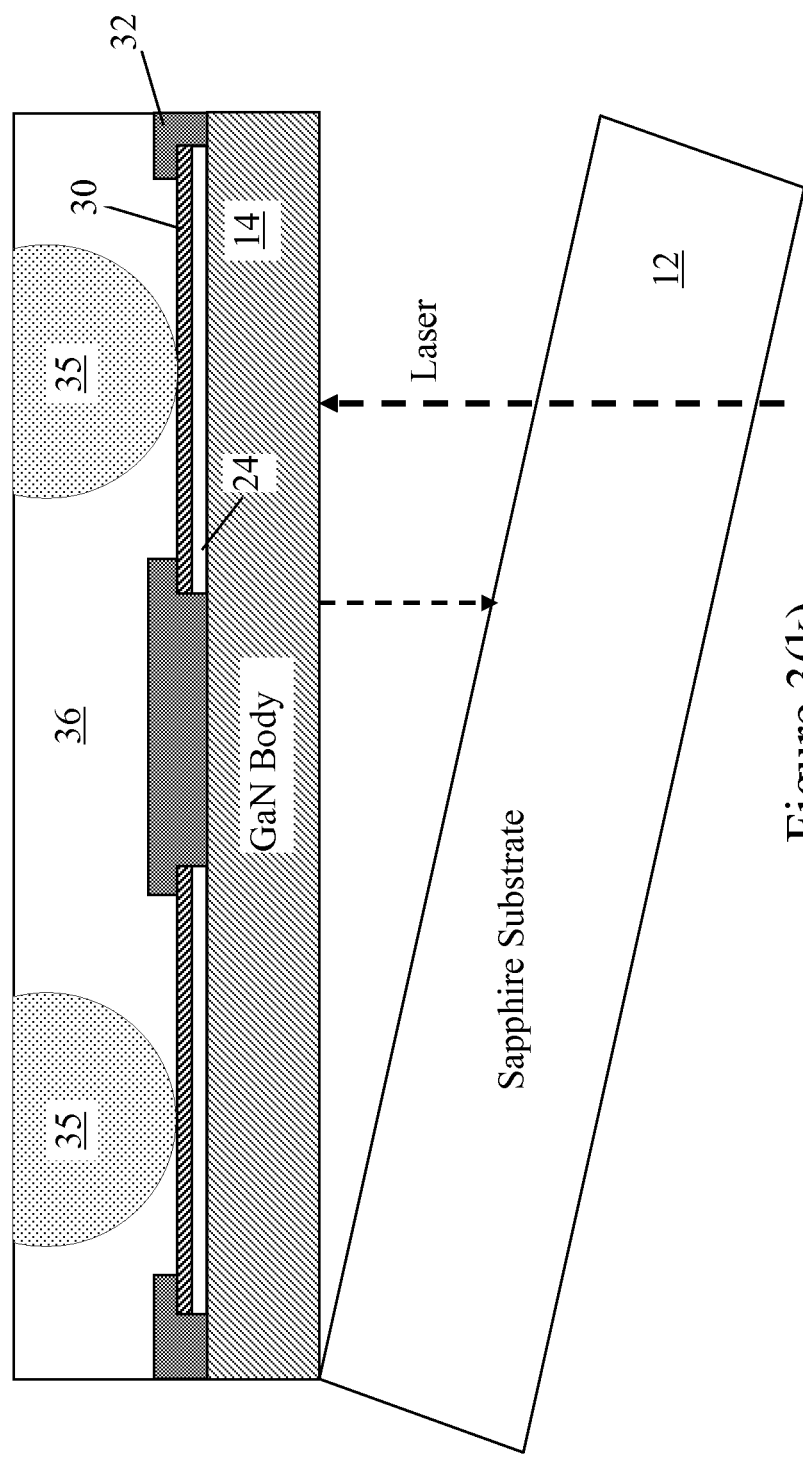
Figure 3L:
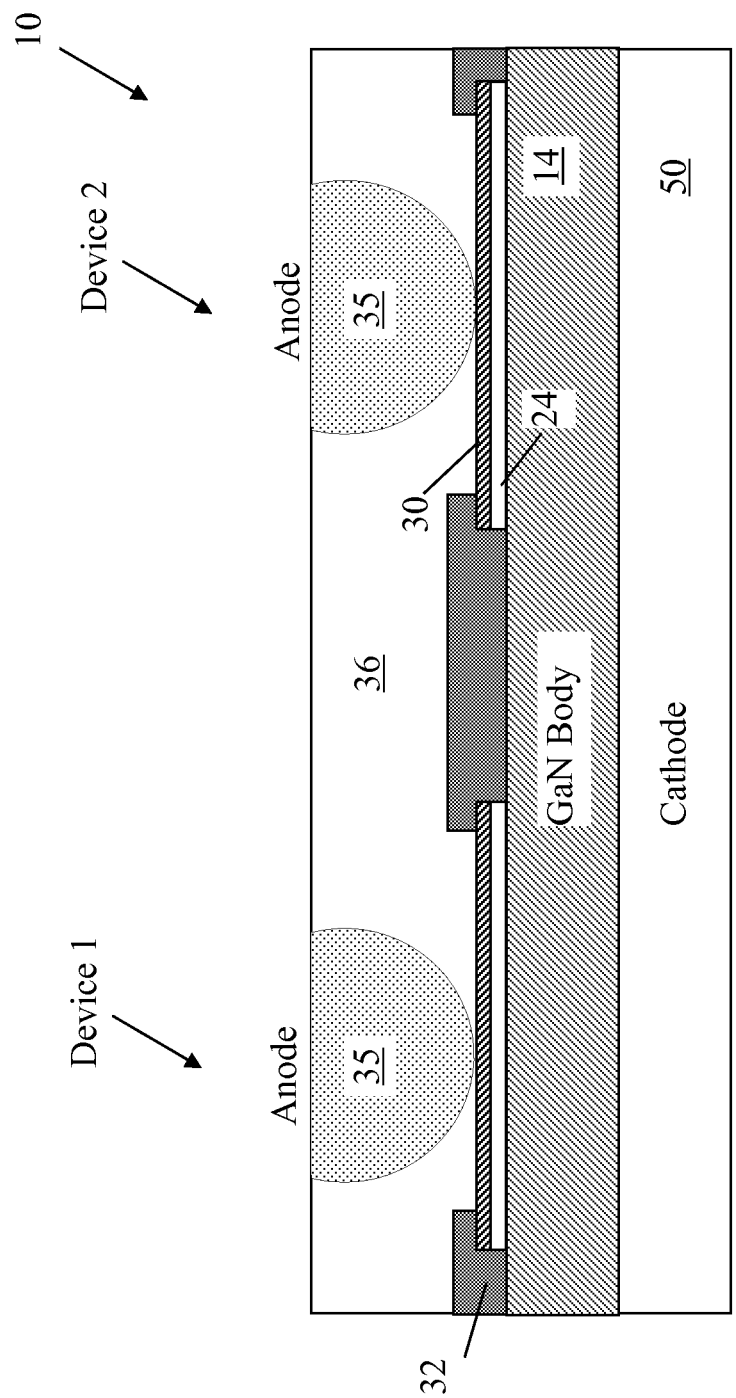
Figure 3M:
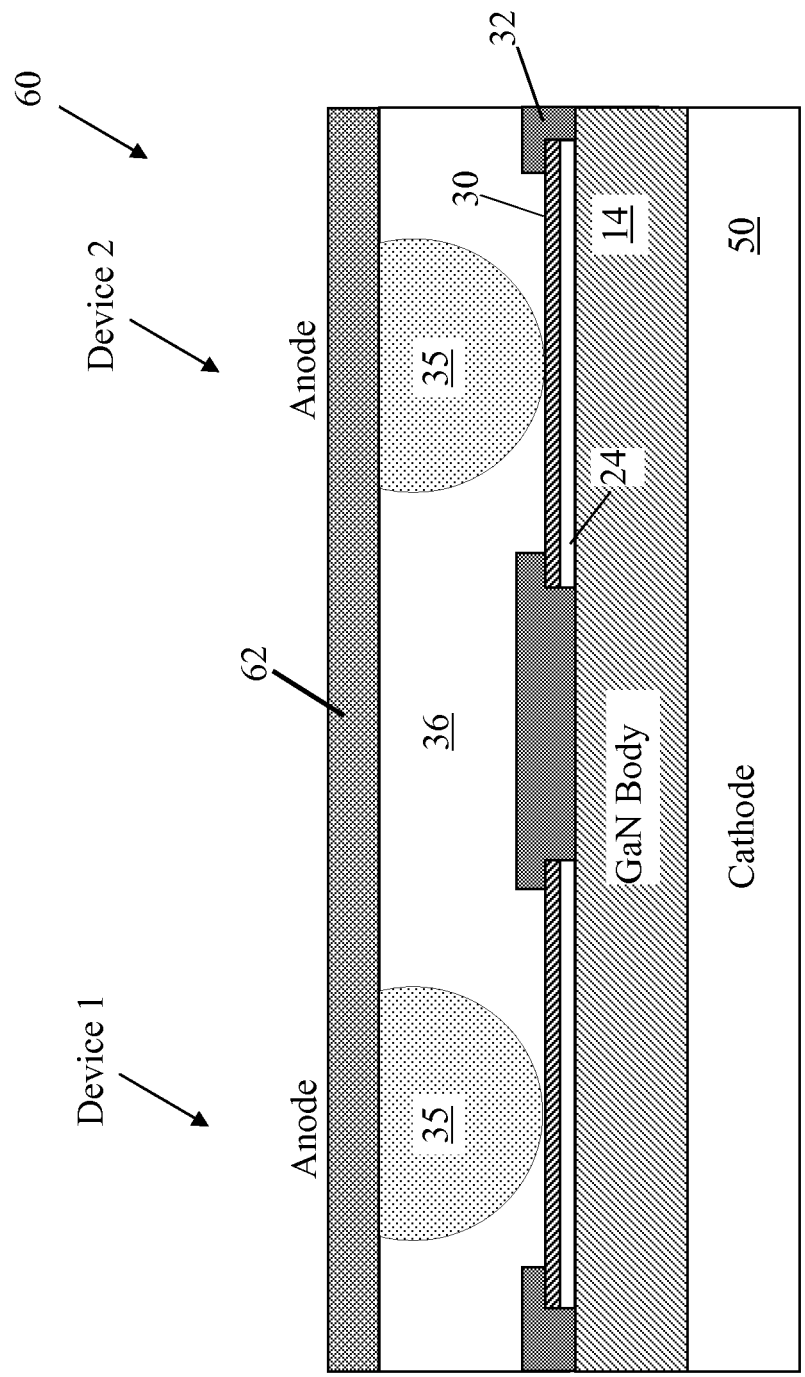

Then, the front side of the device structure in FIG. 3(i) is mechanically polished to planarize portions of the solder ball 35 that protrudes out of the molding layer 36 (step 114). As a result, a planarized front surface of the GaN Schottky diode is formed, as shown in FIG. 3(j). The anode electrode is provided through planarized solder ball 35. In embodiments of the present invention, electrical connection to the anode of the GaN Schottky diode can be made using copper clip or other connection techniques.

After the front side of the Schottky device structure is completed, the molding layer 36 function as a support layer to allow the insulating sapphire substrate 12 of the device structure to be removed from the GaN semiconductor body, thereby exposing the bottom surface of the GaN semiconductor body 14. In practice, the wafer level encapsulation layer is applied on an array of GaN Schottky diode devices formed on a common sapphire substrate. Thus, the wafer level molding layer 36 functions as a wafer handle to allow the GaN semiconductor body thin film to be handled after being separated from the substrate to which it was bonded.

In embodiments of the present invention, the sapphire substrate 12 is separated from the GaN semiconductor body using a laser lift-off process (step 116), as shown in FIG. 3(*k*). A laser lift-off method to separate a sapphire substrate from a GaN thin film is described in U.S. Pat. No. 6,071,795, issued to Cheung et al., which patent is incorporated herein by reference in its entirety. In one embodiment, the sapphire substrate 12 is laser irradiated with a scanned laser beam at a wavelength at which sapphire is transparent. The laser radiation beam is submitted through the sapphire substrate 12 targeting at an interface between the GaN semiconductor body 14 and the sapphire substrate 12. The laser radiation energy is optimized to be absorbed at the interface or in the region in the vicinity of the interface and absorbed radiation energy induces a decomposition of GaN semiconductor body 14 at the interface, thereby allowing the sapphire substrate 12 to be separated from the device structure.

After exposing the backside of the GaN semiconductor body 14, a cathode metal layer 50 is formed on the backside of the GaN semiconductor body 14 (step 118), as shown in FIG. 3(*l*). The cathode metal layer 50 forms an ohmic contact to the GaN semiconductor body 14 and serves as the cathode electrode of the GaN Schottky diode. More specifically, the cathode metal layer 50 forms an ohmic contact with the heavily doped N-type GaN layer 16. The cathode metal layer for forming ohmic contacts may be a metal selected from the group of Al, AlSi, Ti, TiSi, Mo, and MoSi.

As thus processed, a vertical GaN Schottky diode 10 is formed with the anode electrode being accessed through solder ball 35 formed on a front side of the device structure and the cathode electrode being accessed through the backside of the device structure. A vertical current path from the anode to the cathode is thus formed in the GaN Schottky diode 10. As described above, in practice, an array of vertical GaN Schottky diodes, such as device 1 and device 2, are formed on a common substrate. After the laser lift-off of the common substrate, the array of vertical GaN Schottky diodes remain formed on the common GaN semiconductor body 14 and the wafer level molding layer 36. The array of vertical GaN Schottky diodes may be used together or they may be singulated into discrete GaN Schottky diodes.

In alternate embodiments of the present invention, an anode metal layer 62 of the vertical GaN Schottky diode 60 may be formed on top of the wafer level molding layer 36 and the planarized solder ball 35 to form a bondable top surface. When the vertical GaN Schottky diodes are singulated into discrete diode devices, the anode metal layer 62 serves as a metal bonding pad to allow the anode to be connected to a bond wire in a package.

Diode Protection Circuit

According to another aspect of the present invention, the vertical GaN Schottky diode as formed above is connected in parallel with a vertical silicon based PN junction diode to serve as a protection circuit. GaN Schottky diodes may have limited robustness in avalanche breakdown even with well-designed termination structures. A silicon based PN junction diode with a lower breakdown voltage is connected in parallel to the GaN Schottky diode to function as a protection circuit. The silicon based PN junction diode does not conduct when the GaN Schottky diode is forward biased. But the silicon based PN junction diode enters breakdown at a lower voltage so as to divert reverse bias avalanche current.

Figure 4:
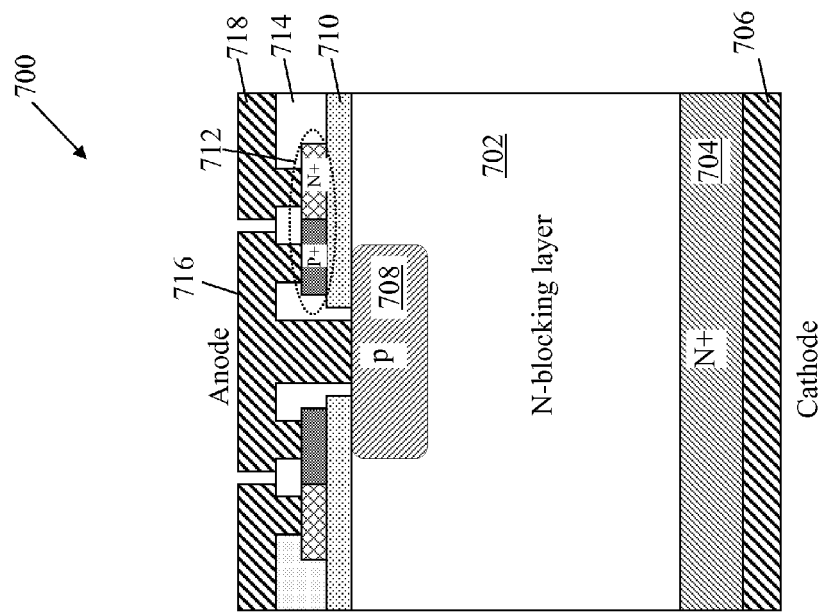
FIG. 4 is a cross-sectional view of a silicon based PN junction diode according to one embodiment of the present invention.

FIG. 4 is a cross-sectional view of a silicon based PN junction diode according to one embodiment of the present invention. A silicon based PN junction diode 700 is formed on an N-blocking layer 702 on an N+ substrate 704. A P-type region 708 is formed on a top surface of the N− blocking layer 702 to form the PN junction. A dielectric field plate 710 is formed around the edge of the anode region formed by P-type region 708. In the present embodiment, a polysilicon PN junction diode 712 is formed on the field plate 710. An insulating dielectric layer 714 is then applied to passivate the edges of the PN junction diodes. The dielectric layer 714 is patterned to allow an anode metal layer 716 to make ohmic contact to the P-type region 708 and to the P+ region of the polysilicon diode 712. A metal connection 718 to the N+ region of the polysilicon diode 712 is also provided. Finally, a cathode metal layer 706 is formed on the backside of the N+ substrate 704 to form the cathode electrode of the vertical PN junction diode.

Figure 5:
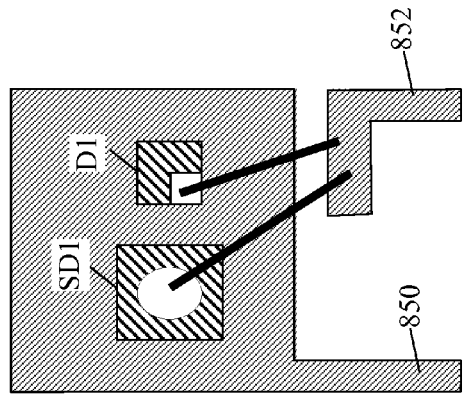
FIG. 5 is a top view of a structure for forming a parallel combination of a GaN Schottky diode and a silicon based PN junction diode according to one embodiment of the present invention.
Figure 5A:
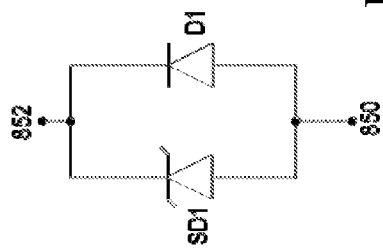
FIG. 5(a) illustrates the equivalent circuit of the structure of FIG. 5.

As thus form, a discrete vertical silicon PN junction diode (D1) may be paired with a vertical GaN Schottky diode (SD1) to serve as a protection circuit to the Schottky diode, as shown in FIG. 5. The vertical GaN Schottky diode (SD1) and the vertical silicon PN junction diode (D1) can be formed on a common metal pad 850 serving as the cathode terminal. The anode electrodes of the Schottky diode SD1 and PN junction diode D1 may be connected to a common metal pad 852 through wire bonds. In this manner, a parallelly connected Schottky diode and PN junction diode circuit is formed, as shown in FIG. 5(*a*). The PN junction diode provides protection to the GaN Schottky diode when the Schottky diode is reverse biased.

Schottky Diode Termination Structure

According to another aspect of the present invention, a termination structure for a nitride-based Schottky diode includes a P-type nitride-based compound semiconductor epitaxial layer ("P-type epitaxial layer") as a guard ring and a dielectric field plate formed on the epitaxial layer. The P-type epitaxial layer and the dielectric field plate are formed at the edge of the anode electrode of the GaN Schottky diode and operate to spread out the electric field at that region, thereby reducing the concentration of electric field at the anode electrode edge. More importantly, the P-type epitaxial layer, being formed by an epitaxial process, is fully activated and the guard ring is thus more effective in spreading the electric field.

In one embodiment, the P-type epitaxial layer includes a step recess to further enhance the field spreading effect of the termination structure. The termination structure, when applied to a GaN Schottky diode, ensures an optimal electric field profile at the edge of the anode electrode, thereby enhancing the reliability of the Schottky diode. Furthermore, the termination structure renders the GaN Schottky diode more rugged in terms of UIS (unclamped inductive switching) capability.

Figure 6:
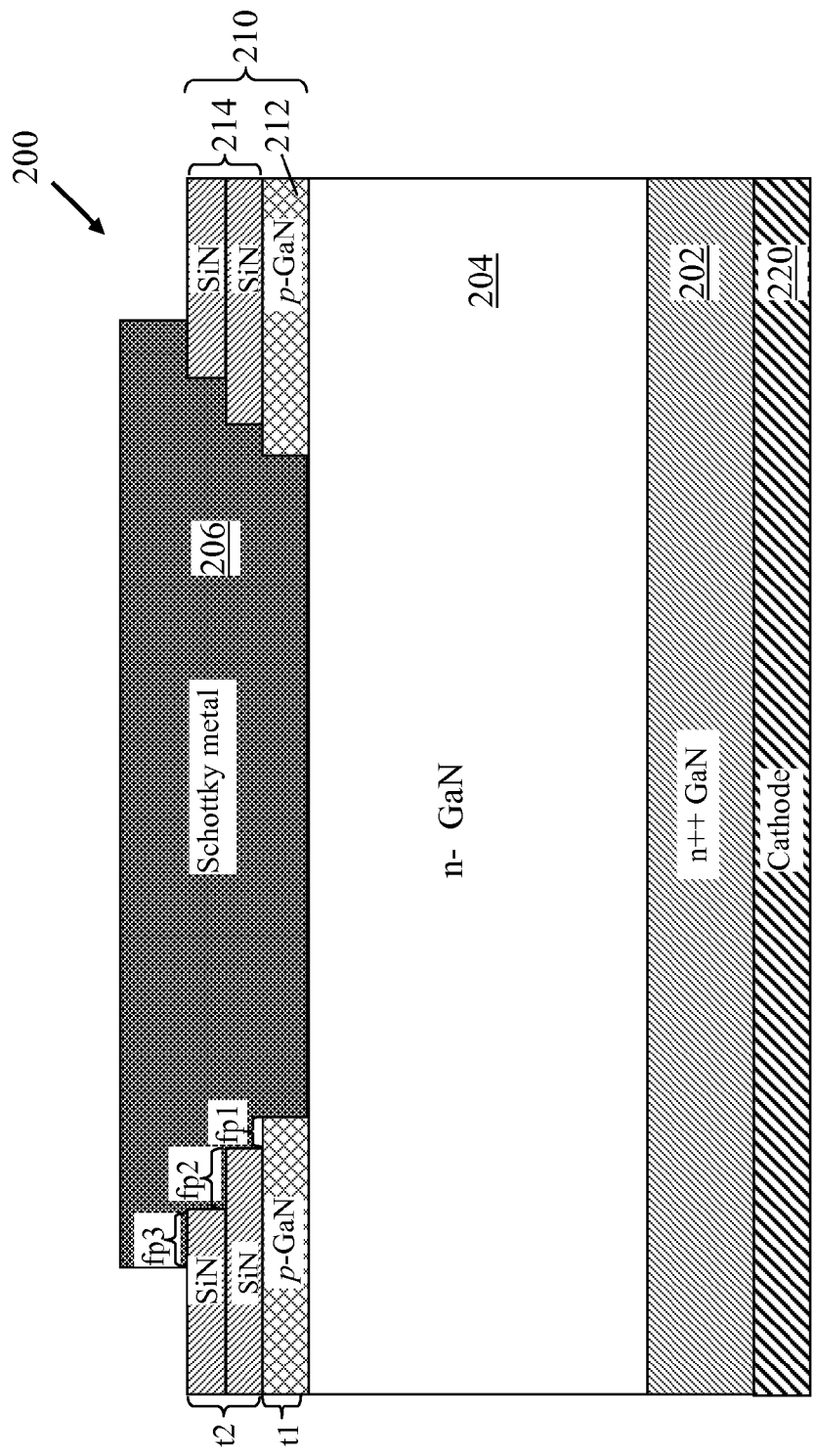
FIG. 6 is a cross-sectional view of a GaN Schottky diode incorporating a termination structure according to one embodiment of the present invention.

FIG. 6 is a cross-sectional view of a GaN Schottky diode incorporating a termination structure according to one embodiment of the present invention. Referring to FIG. 6, a GaN Schottky diode 200 is a vertical conducting GaN Schottky diode formed on a GaN semiconductor body including a lightly doped N-type GaN layer (n− GaN) 204 and a heavily doped N-type GaN layer (n++ GaN) 202. The GaN Schottky diode 200 includes a Schottky metal layer 206 formed on top of the lightly doped N-type GaN layer 204 to form the anode electrode. A Schottky junction is formed at the interface between the Schottky metal layer 206 and the n− GaN layer 204. A cathode metal layer 220 is formed on the backside of the heavily doped N-type GaN layer 202 to form the cathode electrode.

In the embodiments of the present invention, the vertical GaN Schottky diode 200 is formed using the fabrication process for forming the vertical GaN Schottky diode described above with reference to FIGS. 2 and 3(a)-(m). Therefore, the vertical GaN Schottky diode 200 is originally formed on an insulating substrate, such as sapphire, which substrate is lifted off after application of a front-side wafer level molding layer. The Cathode metal layer is then formed on the backside of the n++ GaN layer 202 to form an ohmic contact thereto.

In the present description, the termination structure of the present invention is described as being formed on a vertical GaN Schottky diode. The use of a vertical GaN Schottky diode is illustrative only. The termination structure of the present invention may be applied to GaN Schottky diodes of any configuration, including lateral, quasi-lateral, or vertical conducting diodes. The exact configuration of the GaN Schottky diode is not critical to the practice of the present invention.

In embodiments of the present invention, a termination structure 210 for the GaN Schottky diode 200 includes an epitaxially grown P-type nitride-based compound semiconductor layer ("P-type epitaxial layer") 212 with a dielectric field plate 214 formed thereon. The P-type epitaxial layer 212 is formed on the top surface of the GaN semiconductor body (i.e., on the top surface of n− GaN layer 204) and at the edge of the anode electrode, surrounding the Schottky metal layer 206.

In embodiments of the present invention, the P-type epitaxial layer 212 is a P-type GaN layer. In one embodiment, the P-type GaN epitaxial layer is an epitaxially grown layer formed using a metal organic chemical vapor deposition (MOCVD) process. In other embodiments, other epitaxial process can be used to form the P-type epitaxial layer 212, including molecular beam epitaxy (MBE) and hydride vapour phase epitaxy (HVPE).

In embodiments of the present invention, the termination structure 210 include the dielectric field plate 214 formed on the P-type epitaxial layer 212 to enhance the electric field spreading capability of the termination structure. In one embodiment, the dielectric field plate 214 is a silicon nitride (SiNx) layer and is pull back from the end of the P-type epitaxial layer 212 by an amount "fp1." Furthermore, in embodiments of the present invention, the dielectric field plate 214 is formed with a step recess to further enhance the electric field spreading effect. In the present embodiment, the dielectric field plate 214 includes one step recess having a length of "fp2." In other embodiments, one or more step recesses may be used to realize an optimized electric field profile for the GaN Schottky diode device. In the fabrication process, the termination structure 210 is formed prior to the Schottky metal layer 206 being deposited. When the deposited Schottky metal layer is patterned to form the anode electrode, the Schottky metal layer 206 overlaps the dielectric field plate 214 by an amount "fp3."

In embodiments of the present invention, the P-type epitaxial layer 212 has a doping concentration of $1 \times 10^{17} cm^{-3}$. In embodiments of the present invention, the P-type epitaxial layer 212 has a thickness t1 and on the order of 0.5 to 2 μm in one embodiment. The dielectric field plate 214 has a thickness of t2 and on the order of 0.5-2 μm in one embodiment.

Figure 7:
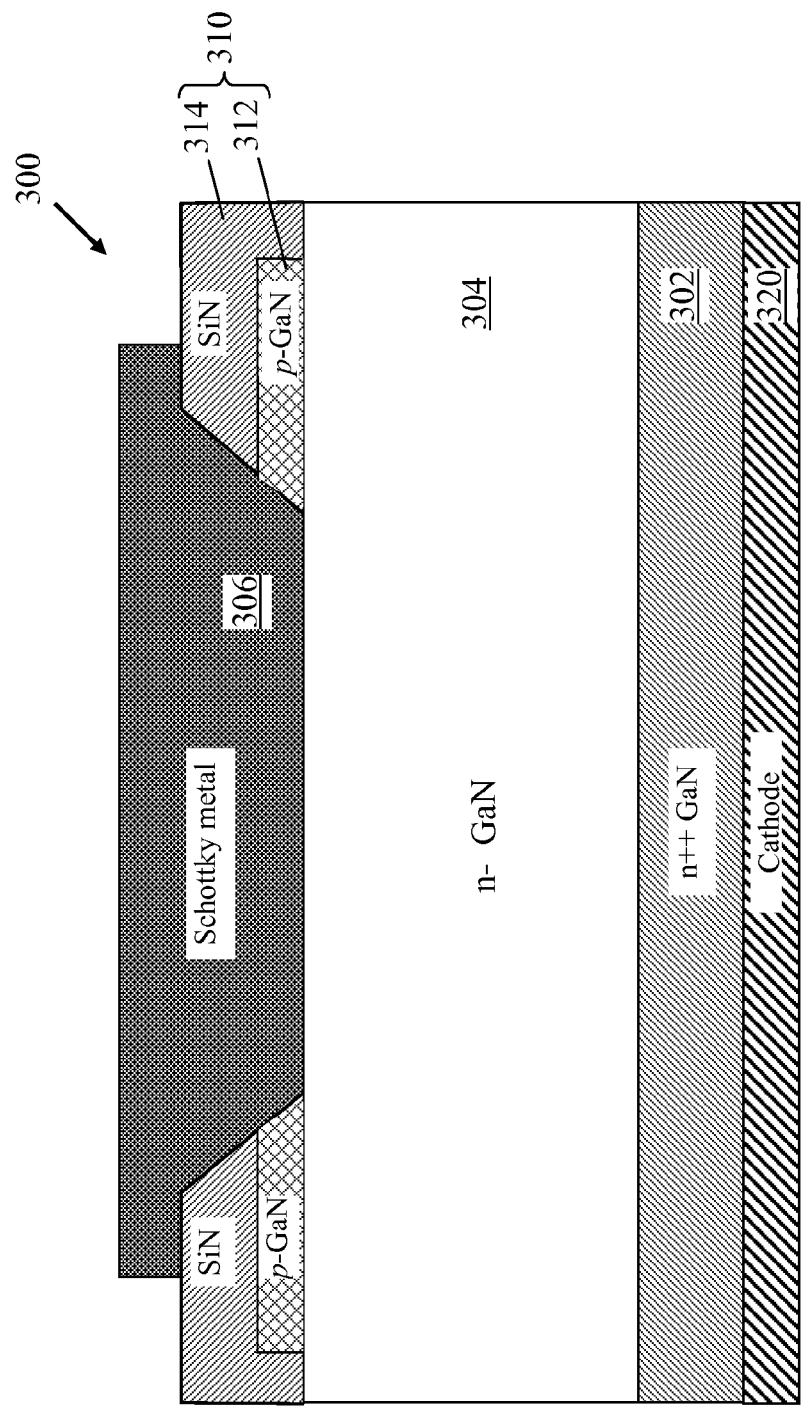
FIG. 7 is a cross-sectional view of a GaN Schottky diode incorporating a termination structure according to an alternate embodiment of the present invention.

In an alternate embodiment of the present invention, the termination structure for a GaN Schottky diode is provided with a slant profile to enhance the electric field profile. FIG. 7 is a cross-sectional view of a GaN Schottky diode incorporating a termination structure according to an alternate embodiment of the present invention. Referring to FIG. 7, a termination structure 310 for a GaN Schottky diode 300 is formed in a similar manner as the termination structure 210 in FIG. 6 and includes a P-type epitaxial layer 312 and a dielectric field plate 314. The GaN semiconductor body includes a heavily doped GaN layer (n++ GaN layer) 302 and a lightly doped GaN layer (n− GaN layer) 304. A cathode metal layer 320 is formed on the backside of the heavily doped N-type GaN layer 302 to form the cathode electrode. However, in the present embodiment, the P-type epitaxial layer 312 and the dielectric field plate 314 are provided with a slant profile, that is a smooth slope extending from the bottom of the P-type epitaxial layer 312 to the top of the dielectric field plate 314. The slanted slope is formed on the inner surface of the termination structure facing the Schottky metal layer 306. A slant profile for the termination structure 310 has the benefit of realizing a smooth electric field profile, thereby providing optimal breakdown performance.

Figure 8:
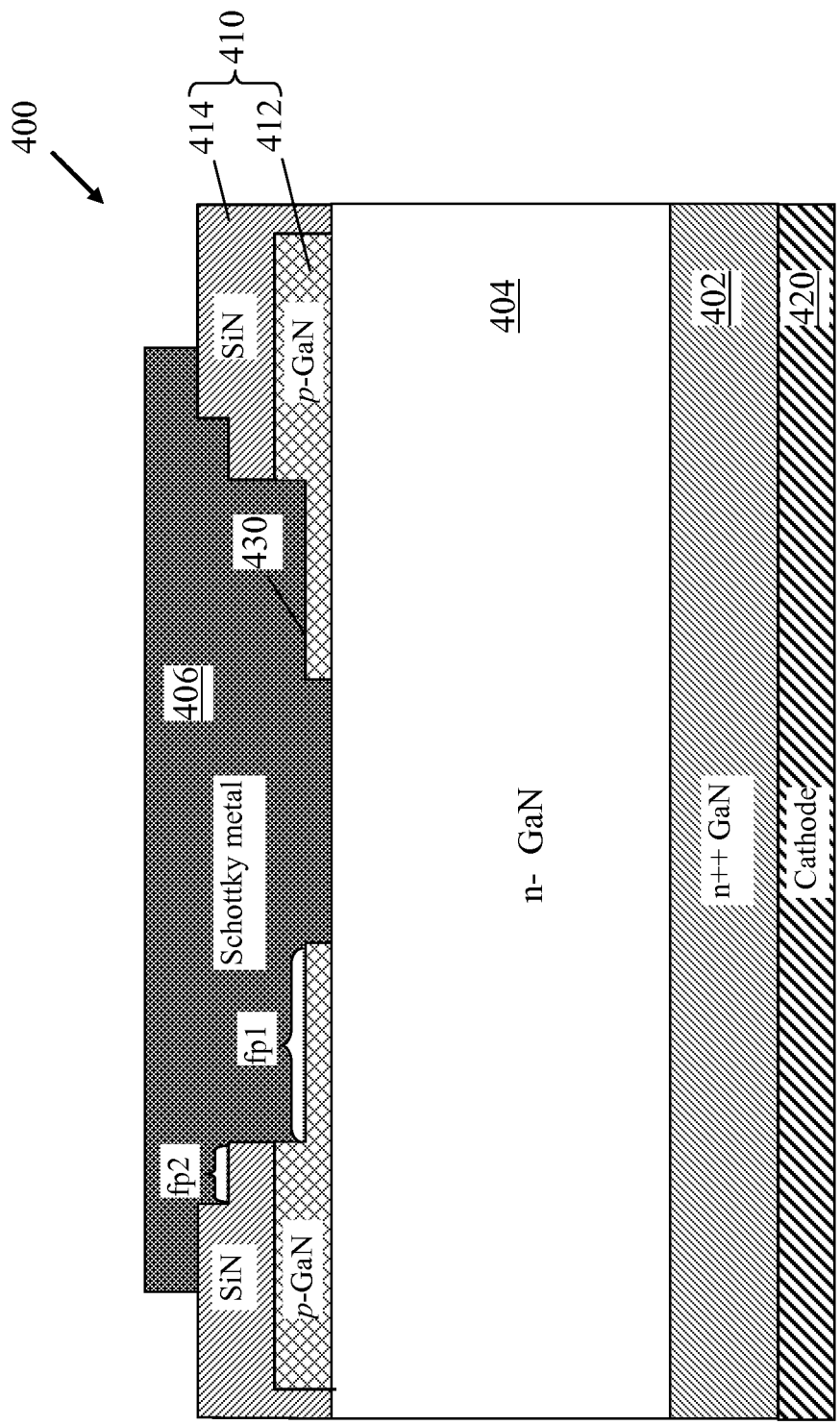
FIG. 8 is a cross-sectional view of a GaN Schottky diode incorporating a termination structure according to a second alternate embodiment of the present invention.

In another alternate embodiment of the present invention, the termination structure for a GaN Schottky diode is provided with a step recess of the P-type epitaxial layer and the dielectric field plate. FIG. 8 is a cross-sectional view of a GaN Schottky diode incorporating a termination structure according to a second alternate embodiment of the present invention. Referring to FIG. 8, a termination structure 410 for a GaN Schottky diode 400 is formed in a similar manner as the termination structure 210 in FIG. 6 and includes a P-type epitaxial layer 412 and a dielectric field plate 414. The GaN semiconductor body includes a heavily doped GaN layer (n++ GaN layer) 402 and a lightly doped GaN layer (n− GaN layer) 404. A cathode metal layer 420 is formed on the backside of the heavily doped N-type GaN layer 402 to form the cathode electrode. However, in the present embodiment, the P-type epitaxial layer 412 and the dielectric field plate 414 are provided with a step recess profile. More specifically, the P-type epitaxial layer 412 has a step recess 430 of length "fp1" and the dielectric field plate 414 has a step recess of length "fp2." The step recess profile of the P-type epitaxial layer 412 and the dielectric field plate 414 tailor the electric field at the anode electrode edge so as to reduce electric field crowding at the edge of the anode electrode. In embodiments of the present invention, the step recess 430 of the P-type epitaxial layer 412 has a length on the order of 1-10 μm The process for forming the termination structure 410 including the step recess in the P-type epitaxial layer 412 and the dielectric field plate 414 will be described with reference to FIGS. 9(a) to 9(f). FIGS. 9(a) to 9(f) are cross-sectional views of a GaN Schottky diode during the intermediate steps of a fabrication process for forming the termination structure of FIG. 8 according to embodiments of the present invention. Referring to FIGS. 9(a) to 9(f), a GaN Schottky diode 490 includes a GaN semiconductor body formed on an insulating sapphire substrate 403. The GaN semiconductor body includes a heavily doped GaN layer (n++ GaN layer) 402 and a lightly doped GaN layer (n− GaN layer) 404. To form the termination structure, a P-type GaN layer 412 is epitaxially grown on the lightly doped GaN layer 404. Then, a silicon nitride layer (SiNx) 440 is deposited on top of the P-type GaN epitaxial layer 412. A photoresist pattern 442 is formed on the silicon nitride layer 440 to define areas where the termination structure is to be formed (FIG. 9(a)).

Then, an etch process is carried out using the photoresist pattern 442 as a mask. The etch process etches both the silicon nitride layer 440 and the P-type epitaxial layer 412 down to a step recess depth in the P-type epitaxial layer, as indicated by the dotted line 445 (FIG. 9(b)). Then another photoresist pattern is applied to cover the termination structure and to etch the P-type epitaxial layer 412 down to the n– GaN layer 404 (FIG. 9(b)). Then, the Schottky metal layer 406 is deposited on the silicon nitride layer 440, the P-type Epitaxial layer 412 and the exposed surface of the n– GaN layer 404 (FIG. 9(c)).

Figure 9A:
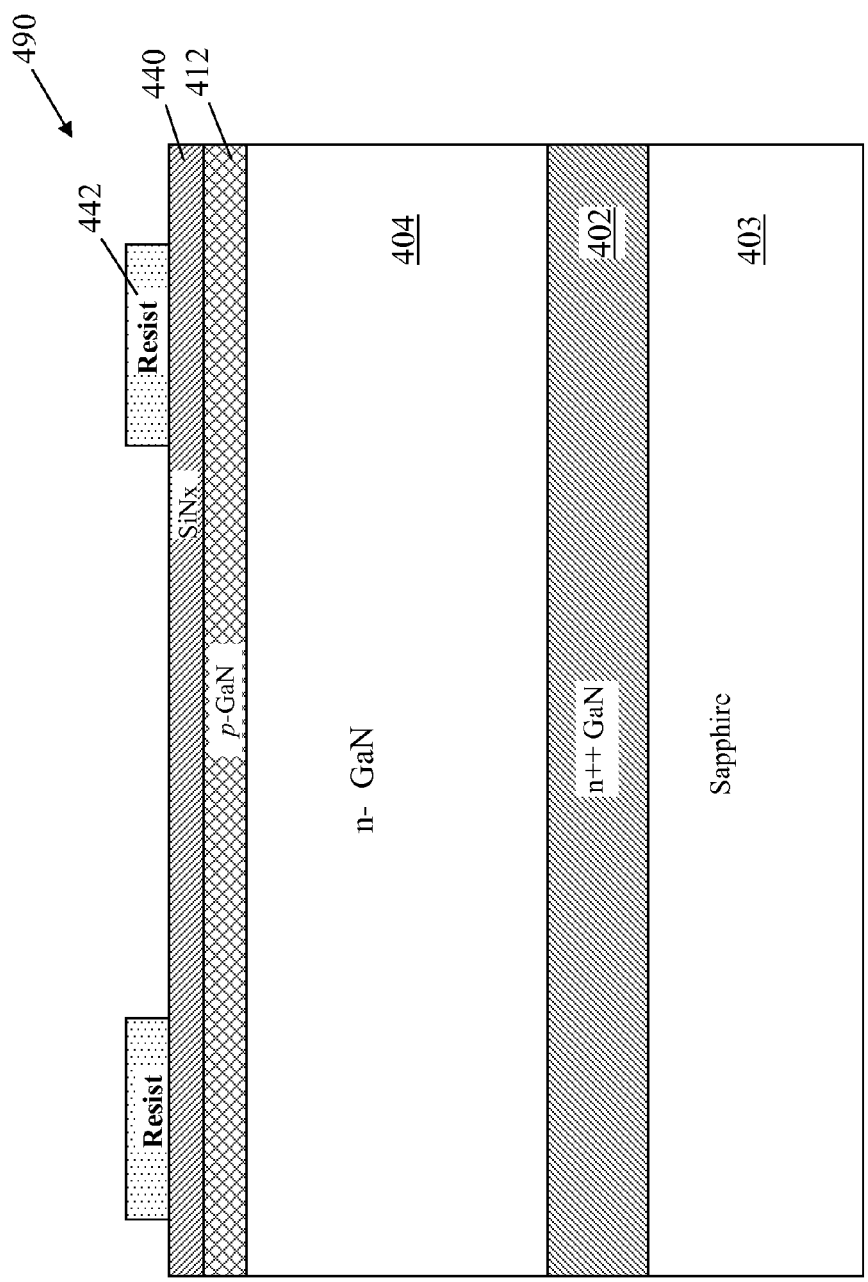
FIGS. 9(a) to 9(f) are cross-sectional views of a GaN Schottky diode during the intermediate steps of a fabrication process for forming the termination structure of FIG. 8 according to embodiments of the present invention.
Figure 9B:
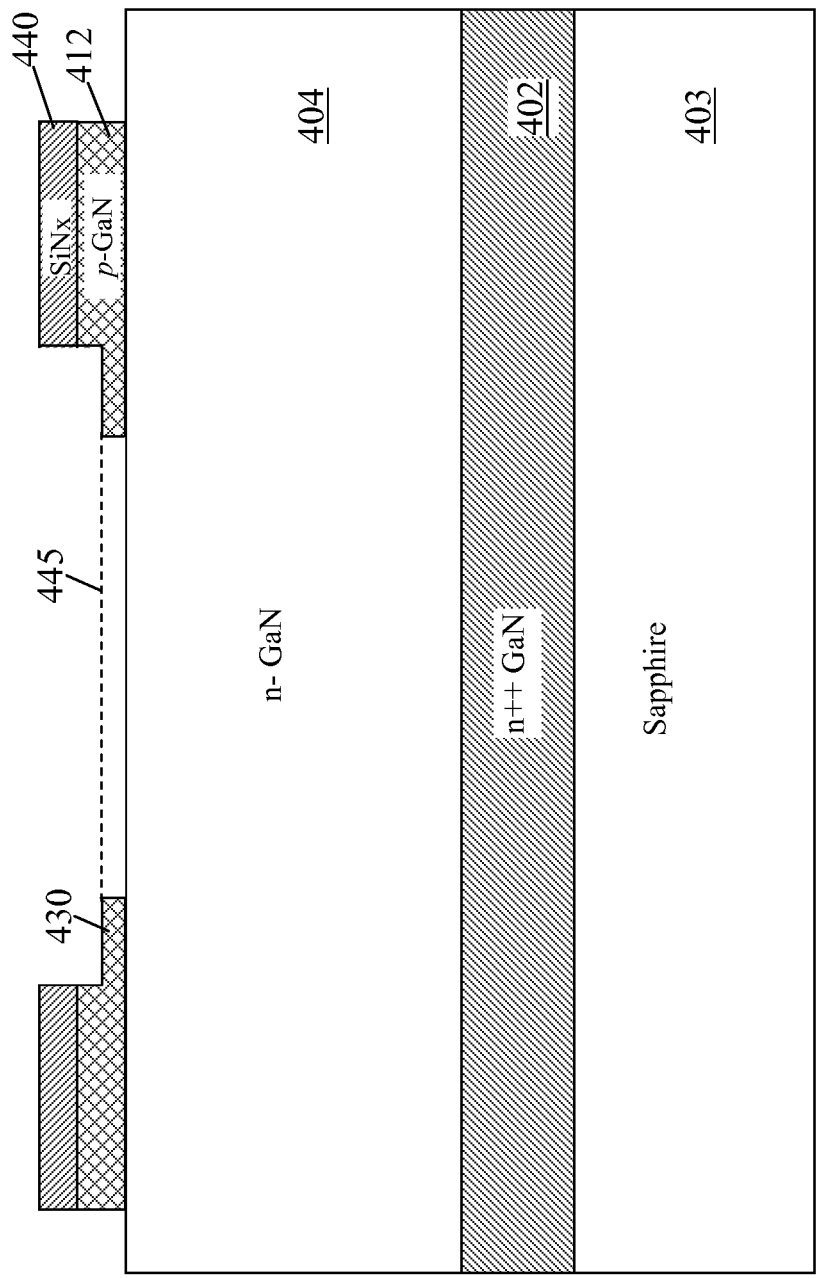
Figure 9C:
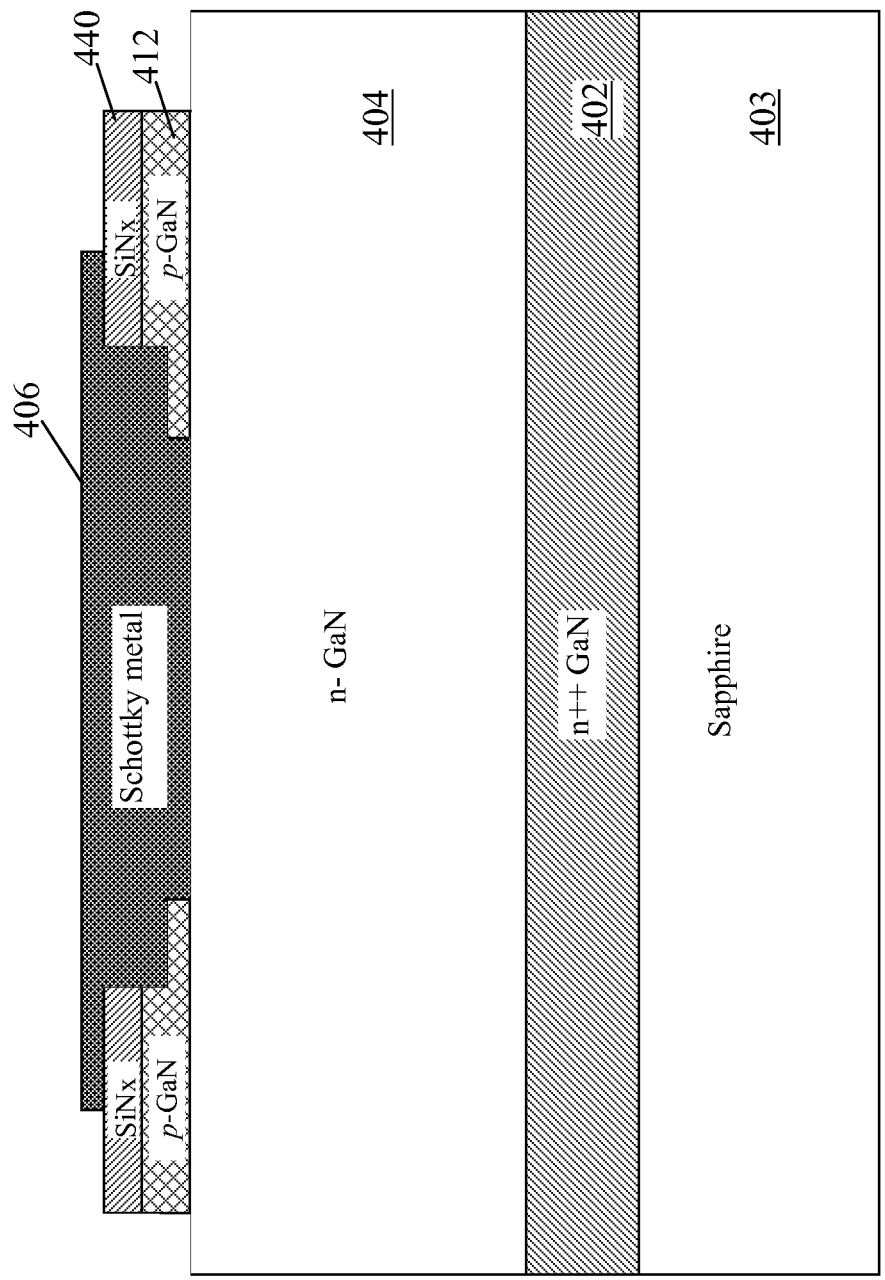
Figure 9D:
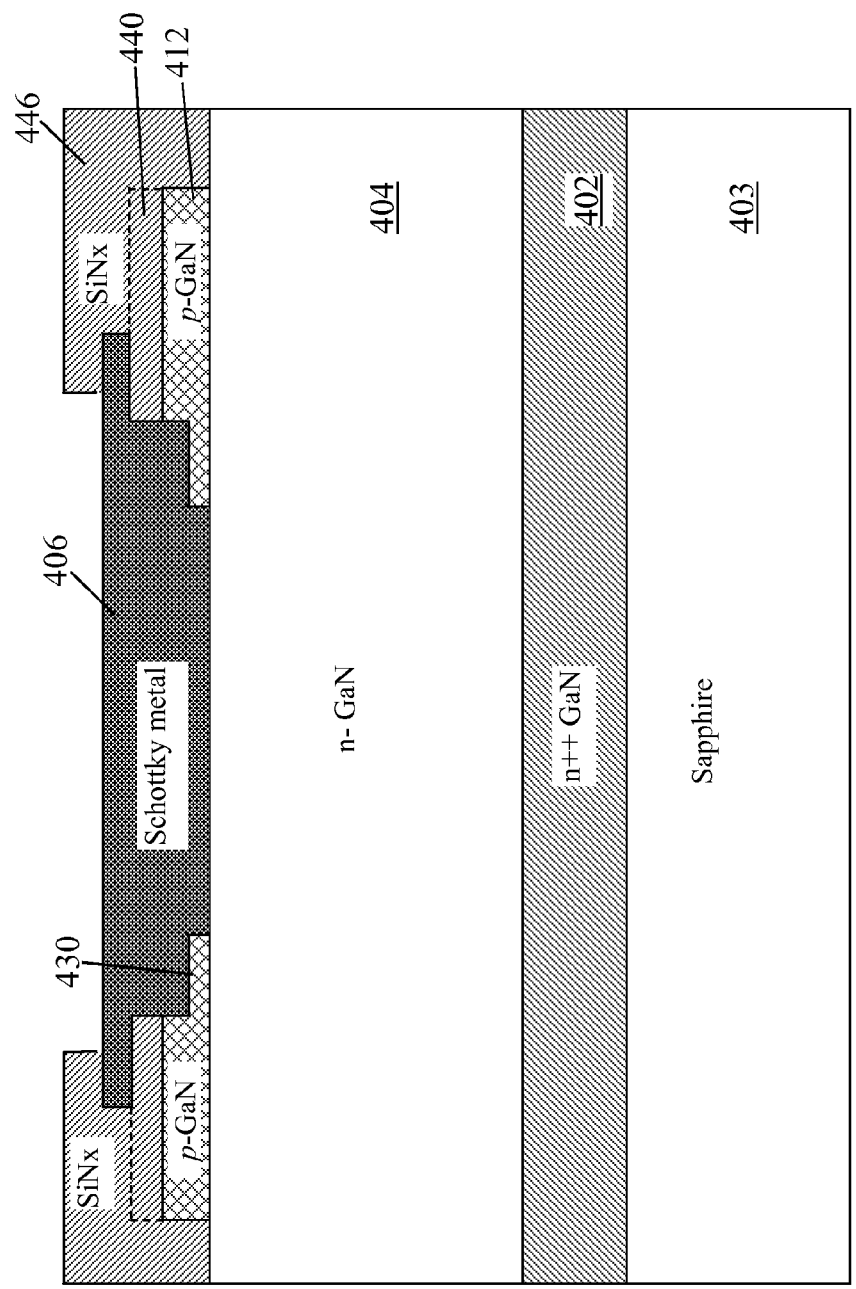

Then, a second silicon nitride layer 446 is deposited on top of the device structure and patterned to form a step recess in the field plate structure, as shown in FIG. 9(d). The dielectric field plate structure 414 is thus formed. In the present embodiment, the Schottky metal layer 406 is formed in between the two silicon nitride layers 440, 446 of the field plate structure. In other embodiments, the Schottky metal layer 406 can be formed on top of the second silicon nitride layer 446, as shown in FIG. 8.

Figure 9E:
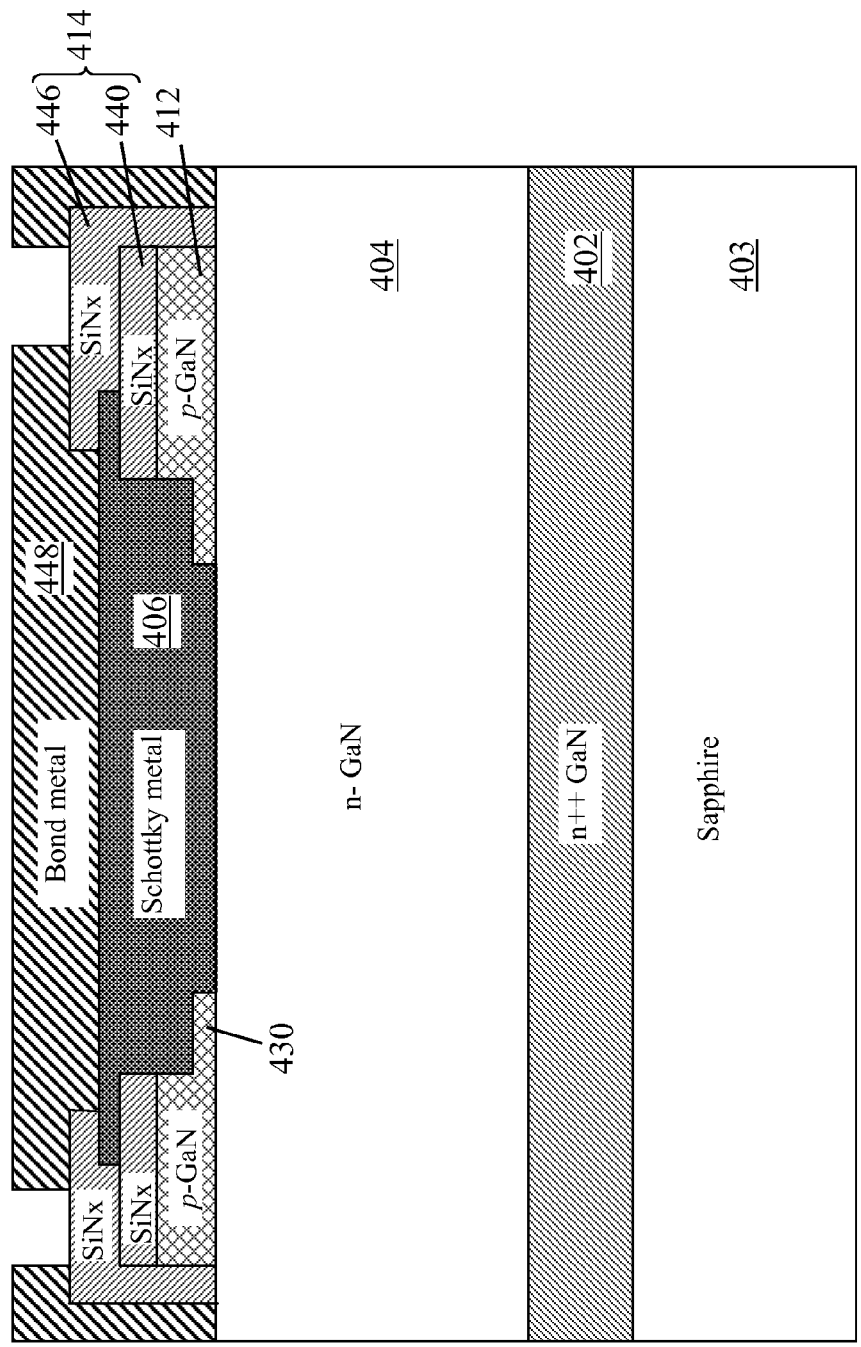
Figure 9F:
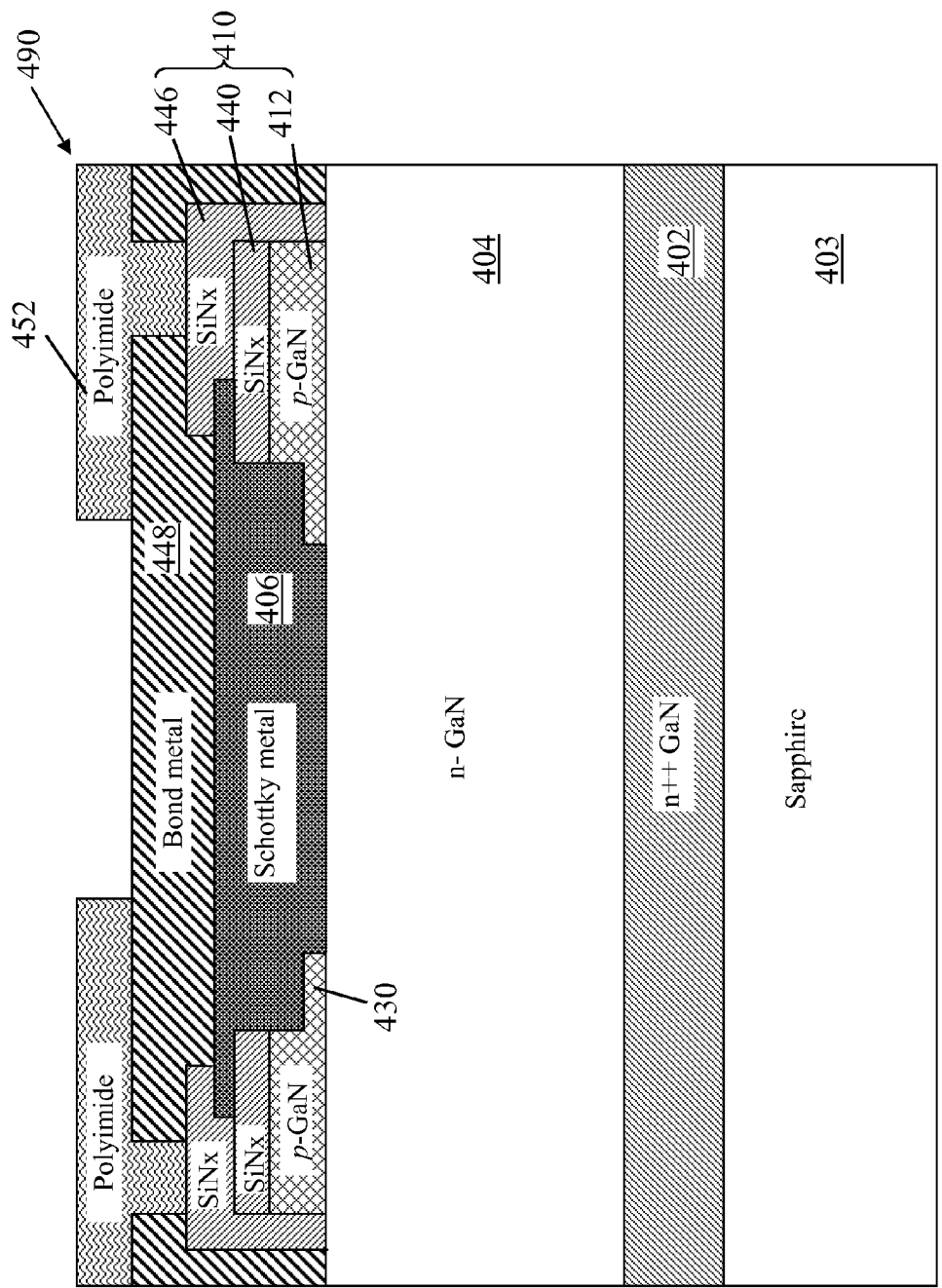

After the termination structure 410 is completed, a bond metal layer 448 is deposited to make electrical contact with the Schottky metal layer 406. The bond metal layer 448 is patterned to form the anode electrode of the GaN Schottky diode 490, as shown in FIG. 9(e). Finally, the edges of the GaN Schottky diode are passivated by a passivation layer, such as a polyimide layer 452, as shown in FIG. 9(f). The GaN Schottky diode 490 including the termination structure 410 is thus formed.

In FIG. 9(f), the GaN Schottky diode 490 is formed on an insulating sapphire substrate 403 and GaN Schottky diode 490 is thus a lateral or quasi lateral diode device. The cathode electrode of the Schottky diode may be brought up to the front side of the device at a location separate from the anode electrode and the termination structure. In embodiments of the present invention, when a vertical GaN Schottky diode is desired, the GaN Schottky diode may be made into a vertical GaN Schottky diode as shown in FIG. 8 and described above with reference to FIG. 2. A vertical GaN Schottky diode may be formed by first encapsulating the front side of the GaN Schottky diode 490 and then performing laser lift-off of the insulating sapphire substrate 403. A cathode metal layer is then deposited on the backside of the n++ GaN layer 402 to form the backside cathode electrode. A vertical GaN Schottky diode can thus be formed.

Figure 10:
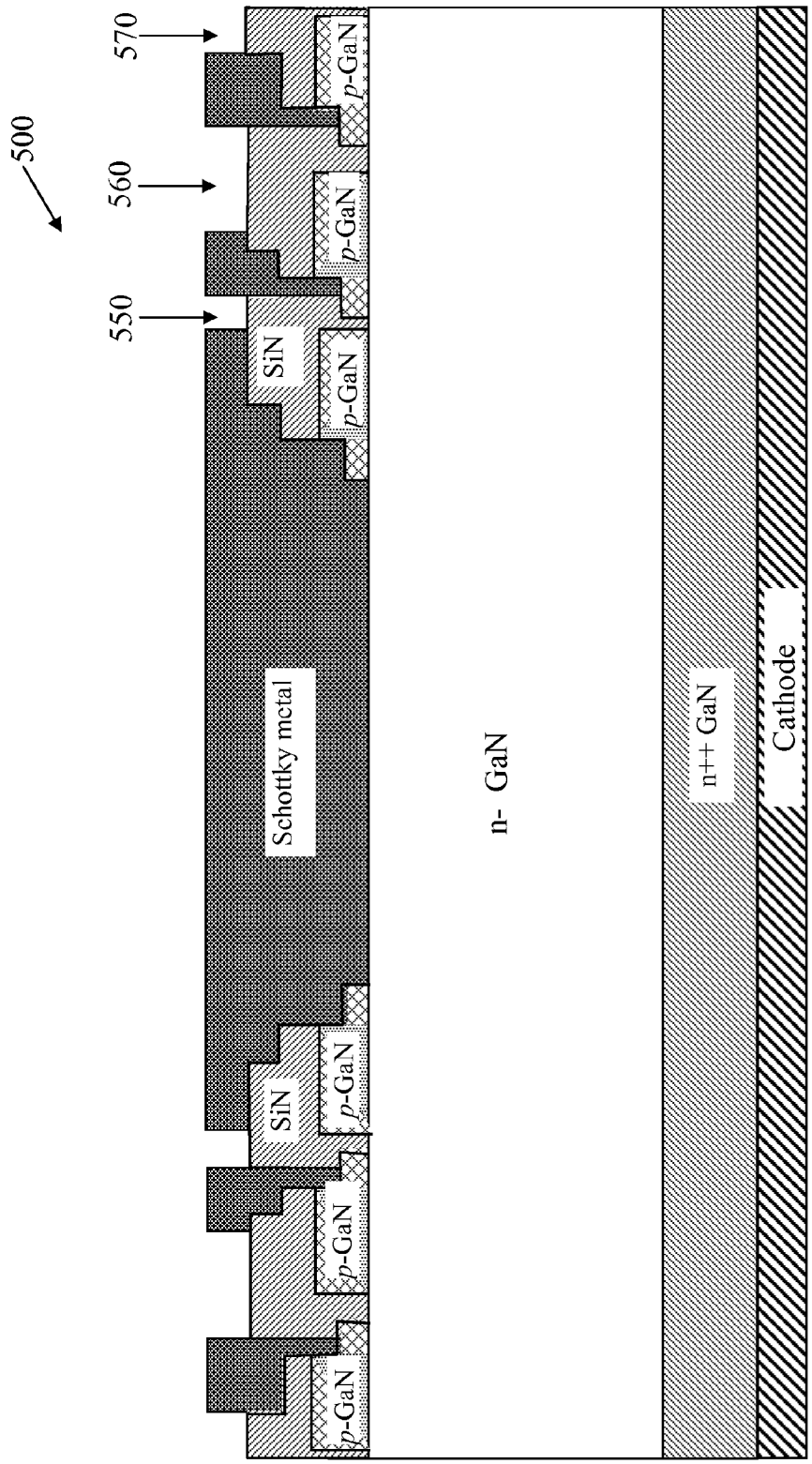
FIG. 10 is a cross-sectional view of a GaN Schottky diode incorporating a termination structure according to a third alternate embodiment of the present invention.

In another alternate embodiment of the present invention, the termination structure for a GaN Schottky diode includes multiple guard ring/field plate structure to further enhance breakdown performance. FIG. 10 is a cross-sectional view of a GaN Schottky diode incorporating a termination structure according to a third alternate embodiment of the present invention. Referring to FIG. 10, a GaN Schottky diode 500 includes a termination structure 510 including multiple guard ring/field plate structures 550, 560, 570. Each of the guard ring/field plate structure can be formed using the configurations described above with reference to FIGS. 6, 7 and 8. In the present embodiment, the guard ring/field plate structure is formed using the step recess structure of FIG. 8 where the P-type epitaxial layer and the field plate both include step recess to tailor the electric field profile. In actual implementation, the multiple guard ring/field plate structures 550, 560, 570 form concentric enclosures surrounding the anode electrode formed by the Schottky metal layer. The multiple guard ring/field plate structures 550, 560, 570 enhance the breakdown performance of the GaN Schottky diode 500 by effectuating further spreading of the electric field.

Figure 11:
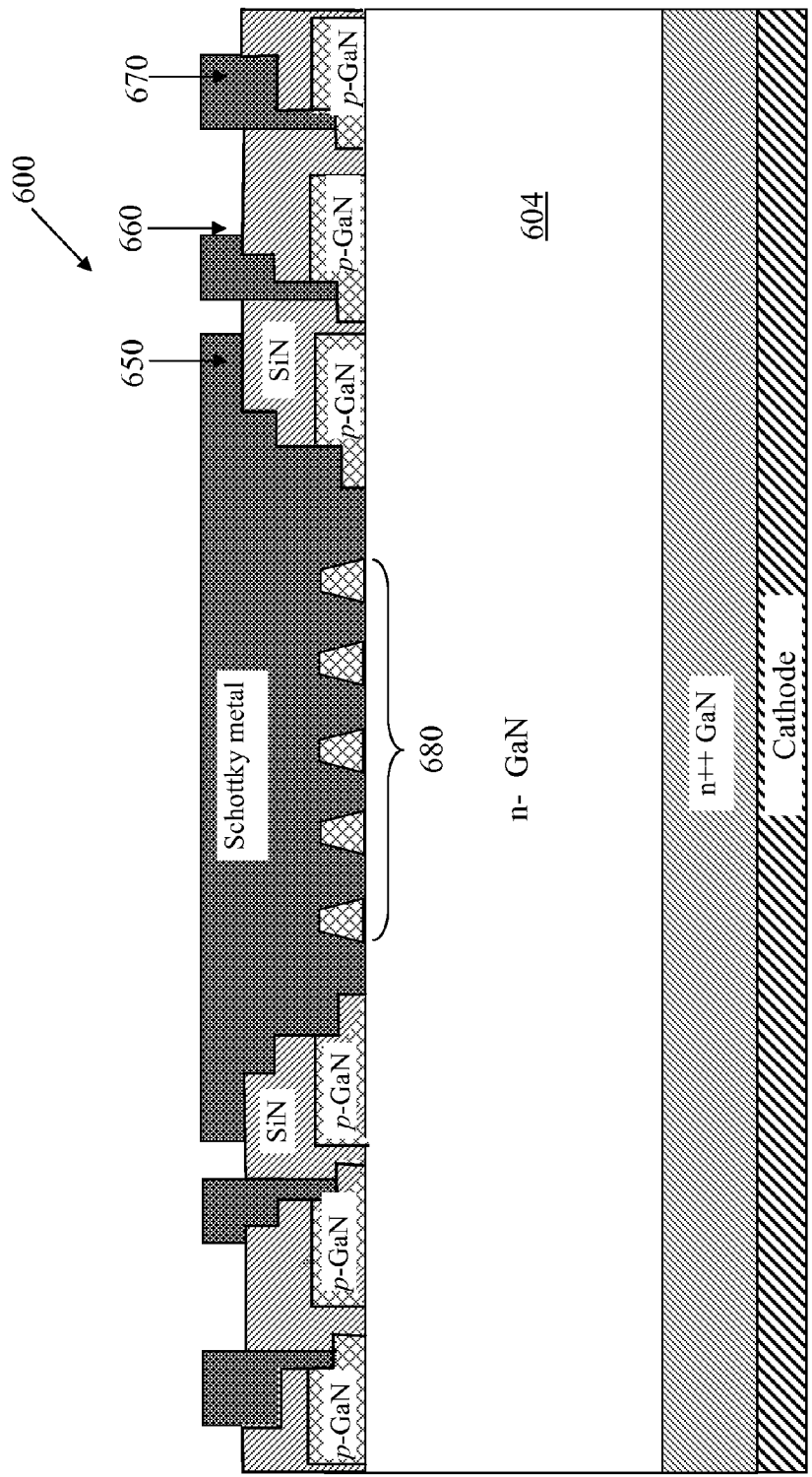
FIG. 11 is a cross-sectional view of a GaN Schottky diode incorporating a termination structure according to a fourth alternate embodiment of the present invention.

In another alternate embodiment of the present invention, a GaN Schottky diode includes a termination structure at the edge of the anode electrode as well as a junction barrier diode structure at the Schottky junction for tailoring the electric field at the Schottky junction. FIG. 11 is a cross-sectional view of a GaN Schottky diode incorporating a termination structure according to a fourth alternate embodiment of the present invention. Referring to FIG. 11, a GaN Schottky diode 600 includes a termination structure 610 including multiple guard ring/field plate structures 650, 660, 670. The GaN Schottky diode 600 further includes an array of junction barrier diodes 680 formed at the Schottky diode junction using islands of the P-type epitaxial layer. The islands of P-type epitaxial layer in contact with the n– GaN layer 604 form an array of junction barrier diodes. The junction barrier diodes have the effect of forming depletion regions along the top surface of the n– GaN layer to reduce the concentration of charge. The breakdown performance of the GaN Schottky diode 600 is thereby enhanced. In other embodiments, the junction barrier diodes 680 may be used with one or more guard ring/field plate structures. The use of the junction barrier diodes 680 with multiple guard ring/field plate structures is illustrative only.

The above detailed descriptions are provided to illustrate specific embodiments of the present invention and are not intended to be limiting. Numerous modifications and variations within the scope of the present invention are possible. The present invention is defined by the appended claims.

We claim:

1. A method for forming a vertical conduction nitride-based Schottky diode, comprising:
   providing an insulating substrate;
   forming a nitride-based semiconductor body of a first conductivity type on the insulating substrate;
   forming a first metal layer on a front side of the nitride-based semiconductor body to form a Schottky junction, the first metal layer forming an anode electrode of the Schottky diode;
   forming a second metal layer on the first metal layer;
   forming a solder ball on the second metal layer;
   forming a wafer level molding layer on the front side of the nitride-based semiconductor body, the wafer level molding layer encapsulating the second metal layer and at least part of the solder ball;
   separating the insulating substrate from the semiconductor body to expose a backside of the nitride-based semiconductor body; and
   forming a third metal layer on an exposed backside of the nitride-based semiconductor body, the third metal layer forming an ohmic contact with the semiconductor body and forming a cathode electrode of the Schottky diode,
   wherein the Schottky diode has a vertical current path from the solder ball, through the anode electrode and the Schottky junction to the cathode electrode.

2. The method of claim 1, further comprising:
   planarizing the solder ball to a top surface of the wafer level molding layer.

3. The method of claim 1, wherein forming a nitride-based semiconductor body of a first conductivity type on the insulating substrate comprises:
   forming a heavily doped gallium nitride (GaN) layer of the first conductivity type on the insulating substrate; and forming a lightly doped gallium nitride (GaN) layer of the first conductivity type on the heavily doped GaN layer, wherein the first metal layer is formed on a top surface of the lightly doped GaN layer and the third metal layer is formed on a back surface of the heavily doped GaN layer after the insulating substrate has been removed.

4. The method of claim 1, wherein separating the insulating substrate from the semiconductor body comprises:
separating the insulating substrate from the semiconductor body using a laser lift-off process.

5. The method of claim 1, further comprising:
forming a termination structure at an edge of the first metal layer, the termination structure being configured to reduce electric field crowding at the edge of the anode electrode.

6. The method of claim 5, wherein forming a termination structure comprises:
forming a guard ring comprising a nitride-based epitaxial layer of a second conductivity type, opposite the first conductivity type, on the front side of the nitride-based semiconductor body at the edge of the first metal layer, the nitride-based epitaxial layer having a step recess where the part of the epitaxial layer having a thinner thickness is disposed towards the Schottky junction of the Schottky diode; and
forming a dielectric field plate on a top surface of the nitride-based epitaxial layer, the dielectric field plate extending up to the step recess of the nitride-based epitaxial layer.

7. The method of claim 6, wherein the nitride-based epitaxial layer comprises a gallium nitride layer of the second conductivity type and the dielectric field plate comprises a silicon nitride layer.

8. The method of claim 6, wherein the first conductivity type comprises N-type conductivity and the second conductivity type comprises P-type conductivity.

9. The method of claim 1, further comprising:
forming a passivation layer on the second metal layer to cover at least edges of the second metal layer.

* * * * *